United States Patent [19]
Lim

[11] Patent Number: 6,151,367
[45] Date of Patent: Nov. 21, 2000

[54] DIGITAL DEMODULATOR

[75] Inventor: Kwang-Woo Lim, Seoul, Rep. of Korea

[73] Assignee: Hyundai Electronics Ind. Co., Ltd., Kyoungki-do, Rep. of Korea

[21] Appl. No.: 09/063,002

[22] Filed: Apr. 20, 1998

[30] Foreign Application Priority Data

Jun. 30, 1997 [KR] Rep. of Korea ............ 97-30195

[51] Int. Cl.[7] .................................. H04L 27/22
[52] U.S. Cl. .................... 375/326; 375/324; 329/309
[58] Field of Search .................. 375/316, 321, 375/324, 326, 327, 339, 340, 344; 455/136, 137, 139, 203, 202, 204, 205, 192.2; 329/304, 315, 318, 319, 306, 325

[56] References Cited

U.S. PATENT DOCUMENTS

| 5,406,587 | 4/1995 | Horwitz et al. ............ 375/346 |
| 5,440,587 | 8/1995 | Ishikawa et al. ........... 375/332 |
| 5,477,199 | 12/1995 | Montreuil ................. 332/103 |
| 5,495,203 | 2/1996 | Harp et al. ............... 329/306 |
| 5,541,672 | 7/1996 | Goeckler ................. 348/726 |
| 5,588,025 | 12/1996 | Strolle et al. ........... 375/316 |
| 5,636,252 | 6/1997 | Patel et al. ............. 375/345 |
| 5,666,084 | 9/1997 | Schulz et al. ............ 329/307 |
| 5,764,102 | 6/1998 | Cochran et al. .......... 329/304 |
| 5,768,323 | 6/1998 | Kroeger et al. .......... 375/355 |
| 5,832,043 | 11/1998 | Eory .................... 375/344 |
| 5,872,815 | 2/1999 | Strolle et al. .......... 375/321 |
| 5,933,460 | 8/1999 | Lee ..................... 375/324 |
| 6,023,491 | 2/2000 | Saka et al. ............. 375/326 |

*Primary Examiner*—Chi H. Pham
*Assistant Examiner*—Emmanuel Bayard
*Attorney, Agent, or Firm*—Reed Smith Shaw & McClay LLP

[57] ABSTRACT

A digital demodulator includes: a local oscillator for generating a predetermined frequency signal; a mixer for mixing an intermediate frequency (IF) signal with a local oscillation frequency signal output by the local oscillator; an A/D converter for converting a signal output by the mixer into a digital signal; an I and Q signal generator for producing I and Q signals from an output of the A/D converter; and a compensation unit for compensating the signals I and Q for phase errors.

10 Claims, 17 Drawing Sheets

DIGITAL DEMODULATOR

BACKGROUND OF THE INVENTION

1. Field of the Invention

The present invention relates to a digital demodulator of a high-definition television (HDTV). Particularly, this invention is a digital demodulator for restoring signals, transmitted in a vestigial-sideband (VSB) manner which is an HDTV transmission standard, to base band signals.

2. Discussion of Related Art

There are many kinds of demodulators. A conventional analog mode of them is shown in FIG. 1. An intermediate frequency (IF) input is respectively mixed with $\cos(\omega_{IF}t)$ and a signal resulting from transit of the phase of $\cos(\omega_{IF}t)$ by 90° by a phase transit element 2 and the mixed results are converted into a base band by mixers 1 and 3. Analog low-pass filters (LPF) 4 and 5 filter off high frequency from the base band signals output by the mixers 1 and 3. The output signals of the analog low-pass filters 4 and 5 are then converted into digital signals I and Q by analog/digital (A/D) converters 6 and 7.

In this case, this conventional analog demodulator requires two IF mixers, two analog low-pass filters, and two A/D converters and its control is difficult. Moreover, relatively expensive parts such as a voltage controlled oscillator (VCQ) must be used. This analog mode also has a disadvantageous application specific IC (ASIC) aspect.

There is another conventional digital demodulation method, as shown in FIG. 2, where sampling is performed with respect to IF signals and the IF signals are then down-converted into base band signals. In other words, IF input is converted into a digital signal by an A/D converter 8 using sampling frequency where its frequency is four times of the IF signal at least. Multiplication of the digital signals from the A/D converter 8 is performed by a multiplier 9. The multiplied signals are sorted and converted into base band signals I and Q by a sorter 10.

FIG. 3 illustrates a typical example of the conventional digital demodulator that converts VSB signals received into digital signals by sampling.

Reference number 11 is a mixer 11 for mixing an IF signal input with oscillation frequency generated by a voltage controlled oscillator 18. 12 denotes a low-pass filter for filtering off high frequency from the frequency generated by the mixer 11 and producing a frequency band of 10.76 MHz. 13 represents an A/D converter for converting the signals from the low-pass filter 12 into digital signals using 21.52 MHz sampling frequency. 14 is a mixer for mixing the digital signals from the A/D converter 14 with 5.38 MHz frequency. 15 is a sorter for sorting the signals generated by the mixer 14 and producing base band signals I and Q. 16 denotes a frequency and phase detector for detecting frequency and phase errors from the base band signals I and Q supplied by the sorter 15 and producing pulse width modulation (PWM) signals according to the detected value. 17 is a low-pass filter for performing low-pass filtering with respect to the PWM signals generated by the frequency and phase detector 16. 18 is a voltage controlled oscillator (VCO) for controlling output oscillation frequency according to a control voltage generated by the low-pass filter 17.

A digital demodulator having such configuration using conventional IF sampling method is a form of appropriate combination of digital and analog modes. There occur some problems difficult to resolve when this structure is implemented in hardware. First, this method requires a voltage controlled crystal oscillator (VCXO) having a high output frequency swing (100 kHz) or VCO where precise control is possible. However, an actually available VCXO has a control input of 0 to 6V and an output swing of maximum 200 ppm (8 kHz at 40 MHz). For an actual VCO, a control input is 0 to 6V and an output swing is minimum 10% (4 MHz at 40 MHz). They cannot satisfy the output frequency swing (100 kHz) condition proposed by Zenith Company. Secondary, even if there is a VCO satisfying the above condition, a D/A converter over 18 bits at least which operates at 1.4 MHz or more is required for precise control, thereby making it difficult to implement hardware.

There are different ways for converting IF signals of VSB into digital base band signals. FIG. 4 shows a digital demodulator using hilbert transform of the ways.

Reference number 19 is an A/D converter for converting VSB IF signals input into digital signals. 20 is a delay circuit for delaying the digital signals from the A/D converter 19 until the time of hilbert transform. 21 is a decimation circuit for producing the base band signal I by performing filtering with respect to the digital signal from the delay circuit 20 with a decimation filter. 22 denotes a hilbert transform unit 22 for performing filtering with respect to the digital signal from the A/D converter 19 with a hilbert transform filter. 23 is a decimation unit for producing the base band signal Q by performing filtering with respect to the digital signal from the hilbert transform unit 22 with a decimation filter.

In such a digital process mode using the hilbert transform, as described above, sampling is performed with respect to the IF signal extracted from the VSB signal received with an established sampling signal and then the signal is quantized and converted into a digital signal by the A/D converter 19. The digital signal from the A/D converter 19 is delayed until the time of hilbert transform by the delay circuit 20 and converted into the base band signal I through the decimation filtering by the decimation unit 21. On the other hand, the digital signal from the A/D converter 19, after passing through the hilbert filtering at the hilbert transform unit 22 and the decimation filtering at the decimation unit 23, is converted into the base band signal Q.

The VSB demodulator has a frequency and phase detector for detecting frequency and phase errors from a signal input and compensating the signal received. A representative method used by the detector is to estimate the frequency and phase using a balanced quadricorrelator. This balanced quadricorrelator method is shown in FIG. 5.

Reference numbers 24 and 25 denote mixers for respectively mixing two kinds of frequencies generated by a phase transit element (not shown) with an input signal $V_{IN}(t)$. 26 and 27 are low-pass filters for performing low-pass filtering with respect to the each signal of the mixer 24 and 25. Reference numbers 28 and 29 represent differentiators for respectively differentiating the signals $V_I(t)$ and $V_Q(t)$ from the low-pass filters 26 and 27. 30 is a mixer for mixing the signal output by the differentiator 28 with the signal output by the low-pass filter 27. 31 is a mixer for mixing the signal output by the low-pass filter 26 with the signal output by the differentiator 29. 32 represents an adder for summing up the signals output by the two mixers 30 and 31 and producing a frequency and phase error signals $V_D(t)$.

In such a frequency and phase detector applied to the conventional VSB demodulator, the mixers 24 and 25 respectively multiply the received signal $V_{IN}(t)$ by $\cos \omega_0 t$ and $\sin \omega_0 t$. The two low-pass filters 26 and 27 perform the low-pass filtering with respect to the result values of multiplication respectively and producing the base band signals $V_I(t)$ and $V_Q(t)$. A frequency estimation error and a phase are detected by differentiating the base band signals $V_I(t)$ and $V_Q(t)$ with the differentiators 28 and 29 and then obtaining their change ratios.

When the signal received is expressed as a formula (1), $V_{in}(t)=V_s \cos(\omega_i t+\theta)$, respective outputs by the low-pass filters 26 and 27 are represented with a formula (2), $V_I(t)=V_s K_m \cos(\Delta\omega t+\theta)$ and formula (3), $V_Q(t)=V_s K_m \sin(\Delta\omega t+\theta)$, and the outputs by the differentiators 28 and 29 are represented with a formula (4), $T_d dv_I(t)/dt=\Delta\omega T_d V_s K_m \sin(\Delta\omega t+\theta)$, and formula (5), $T_d dv_Q(t)/dt=-\Delta\omega T_d V_s K_m \cos(\Delta\omega t+\theta)$, wherein $T_d$ is a gain of the differentiator and expressed as $\Delta\omega=\omega_i-\omega_0$.

Therefore, $V_d(t)=V_Q(t)(dv_I(t)/dt)-V_Q(t)(dv_Q(t)/dt)=2T_d(V_s K_m)^2\Delta\omega \ldots$ (6). As we can see from the formula (6), a frequency error can be estimated regardless of an input phase $\theta$. When digitalizing this structure, only with a relatively simpler XOR gate instead of a multiplier, satisfactory compensation for the frequency error can be achieved.

When $\Delta\omega=0$ or $<<1$ in the formula (3), $V_Q(t)=V_s K_m \sin(\theta) \approx V_s K_m \theta \ldots$ (7). So, a phase error can be estimated from the signal Q.

If the balanced quadricorrelator shown in FIG. 5 is digitalized, it has the configuration as illustrated in FIG. 6. Reference numbers 24, 25, 26, 27, 30, 31, and 32 perform the same function as 24, 25, 26, 27, 30, 31, and 32 shown in FIG. 5. Number 33 and 34 are A/D converters for converting the analog base band signals from the low-pass filters 26 and 27 into the digital base band signals. 35 and 36 denote delay circuits for delaying the signals output by the A/D converters 33 and 34 during a predetermined period of time. 37 is an A/D converter for converting the frequency error signal from the adder 32 into a digital signal. 38 is a loop filter for performing filtering with respect to the output by the A/D converter 37. 39 is a VCO for altering an oscillation frequency according to the signal from the loop filter 38 as control voltage. 40 is a phase transit element for changing the phase of the oscillation frequency output by the VCO 39 by 90°.

There is no differentiator in FIG. 6. Approximation is obtained like $dv(t)/dt \approx [v(k\Delta T)-v((k-1)\Delta T)]/\Delta T \ldots$ (8). When $k\Delta T=n$, $V_d(t) \approx [v_I(n)v_Q(n-1)-v_I(n-1)v_Q(n)]/\Delta T \ldots$ (9), so the digitalization of the balanced quadricorrelator is accomplished.

As mentioned before, however, the conventional digital VSB demodulator must use an expensive VCO, disturbing commercialization, and its frequency and phase detector utilizes many multipliers, making the configuration of hardware complex. In addition, since a portion of the demodulation circuit employs analog process mode, implementation of hardware and ASIC is difficult.

SUMMARY OF THE INVENTION

Accordingly, the present invention is directed to a digital demodulator that substantially obviates one or more of the limitations and disadvantages of the related art.

An objective of the present invention is to provide a digital demodulator for demodulating VSB signals using an inexpensive fixed oscillator through application of a hilbert transform, instead of using an expensive VCO.

Another objective of the present invention is to provide a digital demodulator facilitating design of a circuit in case of implementation of an ASIC by digitalizing hardware.

Additional features and advantages of the invention will be set forth in the description which follows, and in part will be apparent from the description, or may be learned by practice of the invention. The objectives and other advantages of the invention will be realized and attained by the structure as illustrated in the written description and claims hereof, as well as the appended drawings.

To achieve these and other advantages, and in accordance with the purpose of the present invention as embodied and broadly described, a digital demodulator includes: an oscillator for generating a predetermined oscillation frequency; a mixer for mixing the output of the oscillator with an IF signal received; a low-pass filter for performing low-pass filtering with respect to the output of the mixer; an A/D converter for converting the output of the low-pass filter into a digital signal; a delay circuit or delaying the output of the A/D converter; a hilbert transform unit for converting the output of the A/D converter into a complex signal; a complex multiplier for performing selective multiplication of the outputs of the delay circuit and hilbert transformunit and oscillation frequency generated by a numerically controlled oscillator; a pilot filter unit for performing narrow digital low-pass filtering with respect to base band signals I and Q from the complex multiplier and producing a DC signal; a frequency error detect unit for delaying and combining the code part of the signal transmitted from the pilot filter unit and detecting a frequency error; and a loop filter for producing a control voltage for compensating for the phase error obtained from the pilot filter unit and the frequency error obtained from the frequency error detect unit to control the numerically controlled oscillator.

The signal I neighboring a base band is generated by mixing an IF signal with the signal of the oscillator. The signal Q is generated by performing hilbert transform of the I signal. By respectively multiplying the signals I and Q by complex signals corresponding to their phase errors, the phase errors are eliminated and the base band signal is demodulated. Initially, compensation for the frequency error is performed by operating a digital frequency lock loop (DFLL). After a predetermined period of time, once a frequency lock is turned on, a digital phase lock loop (DPLL) operates and compensates for a residual phase error and a frequency error.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

Figure 10:
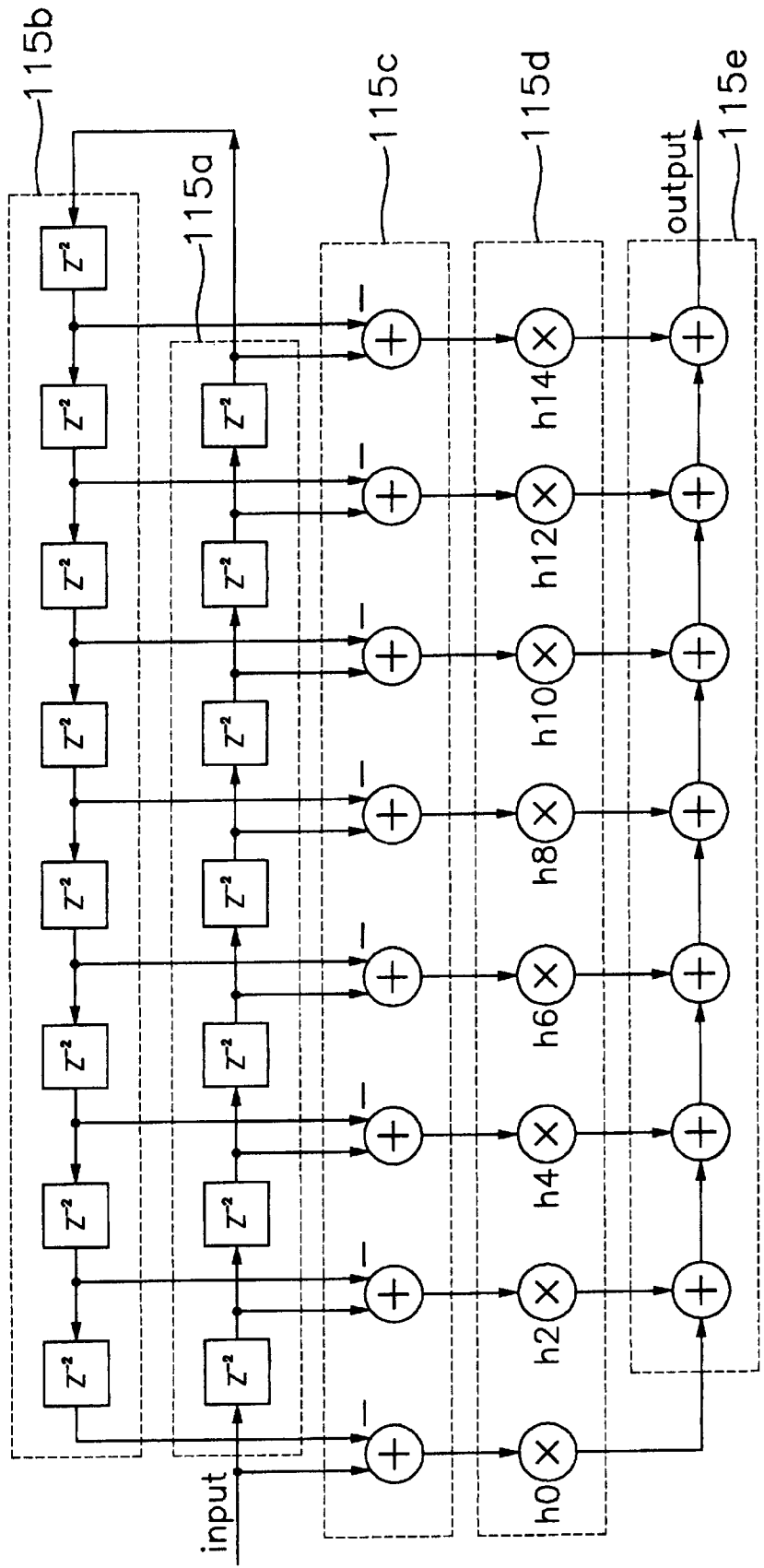
Figure 11:
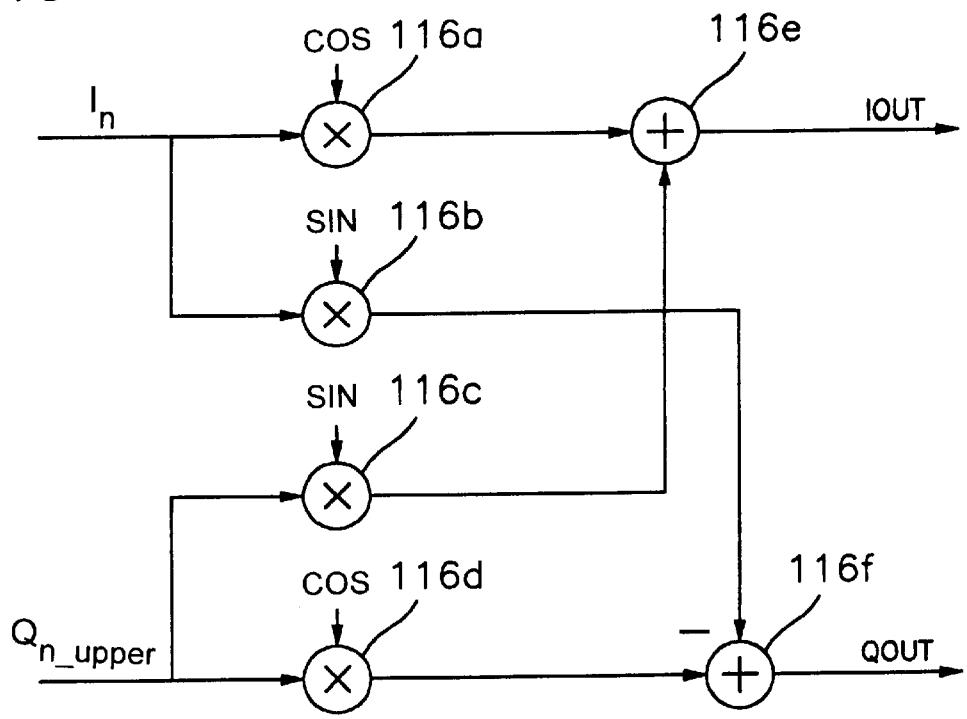
Figure 12:
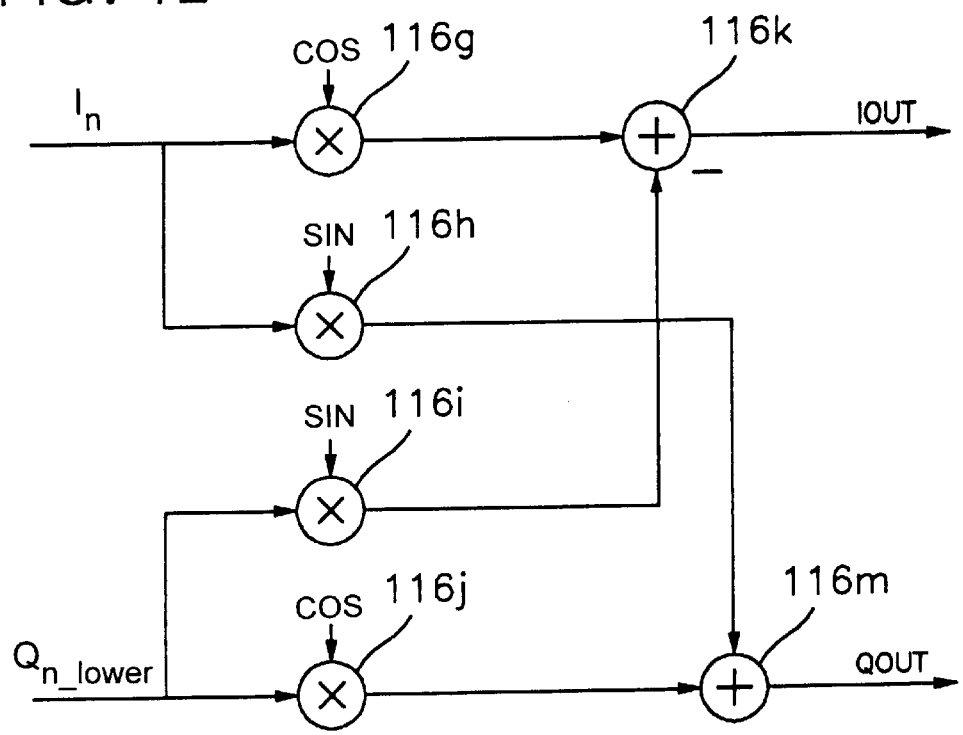
Figure 13:
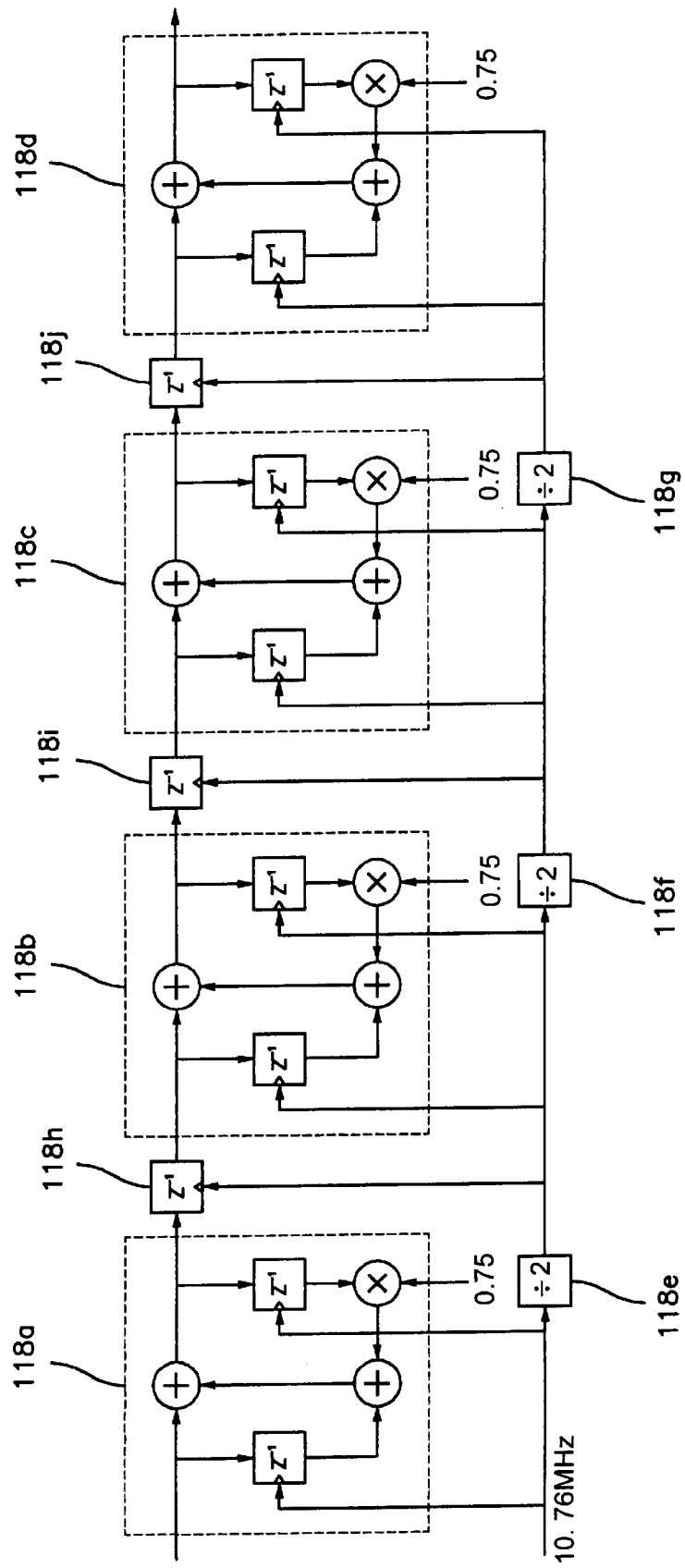
Figure 14:
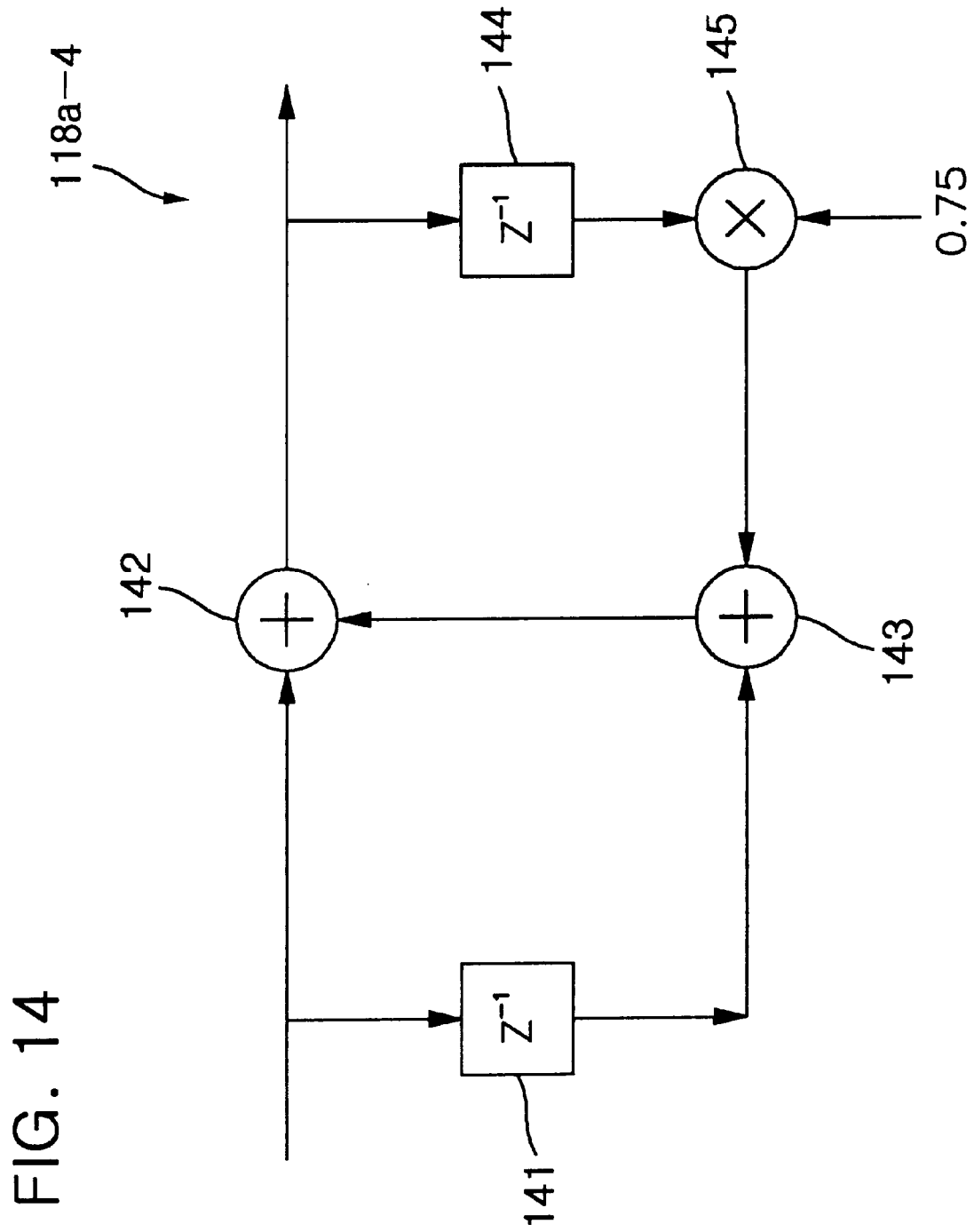
Figure 15:
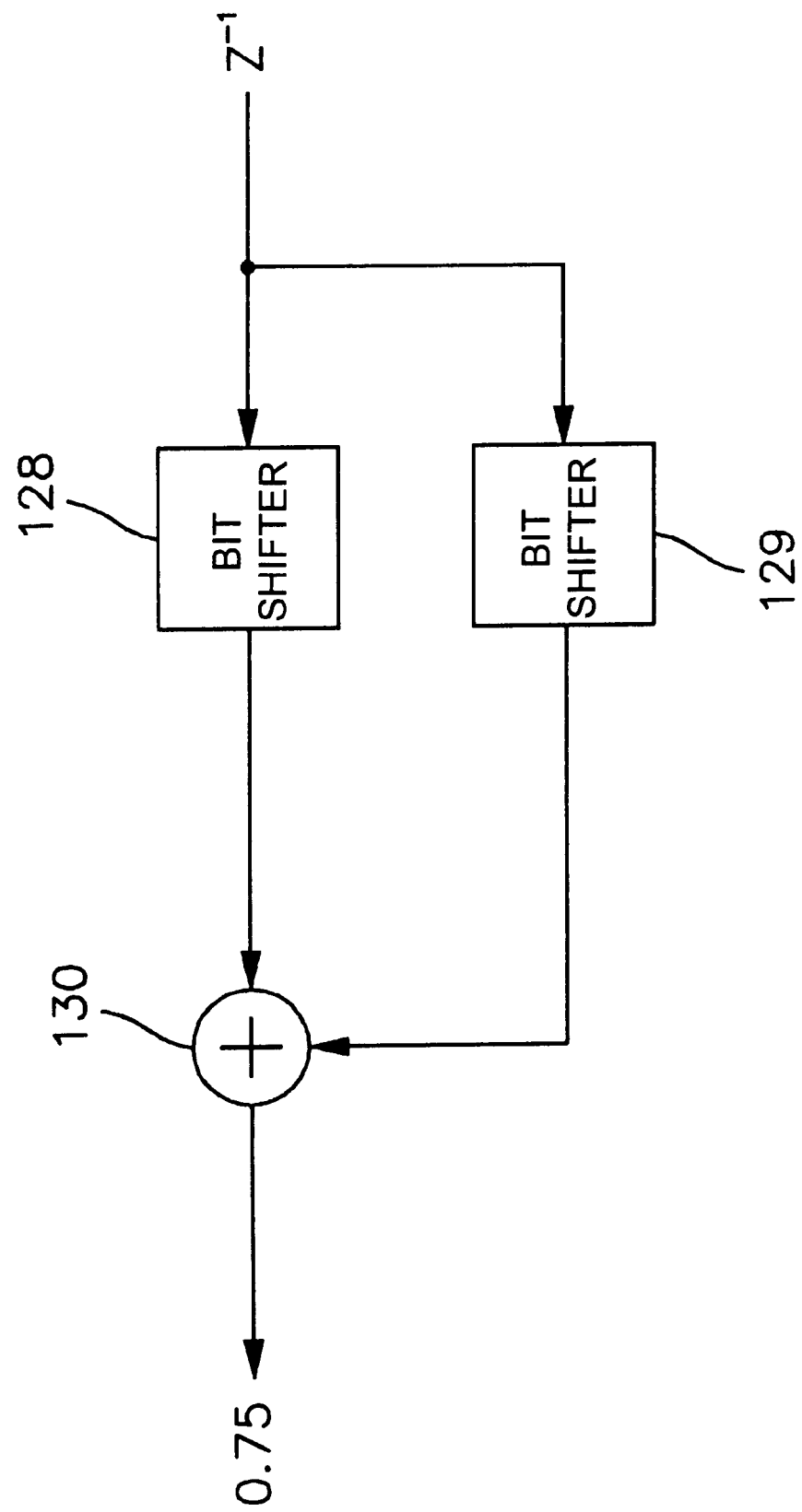
Figure 16:
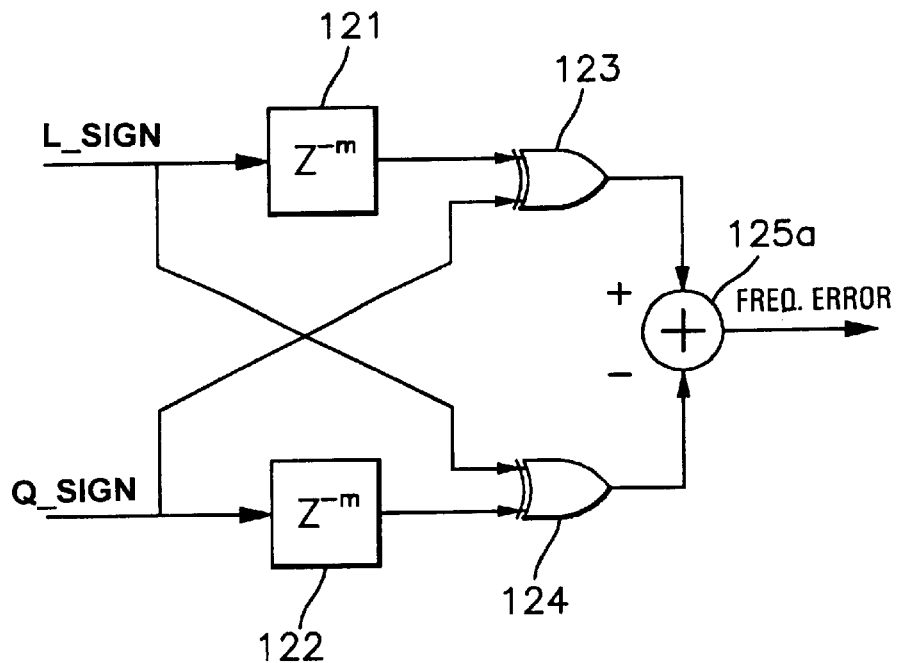
Figure 17:
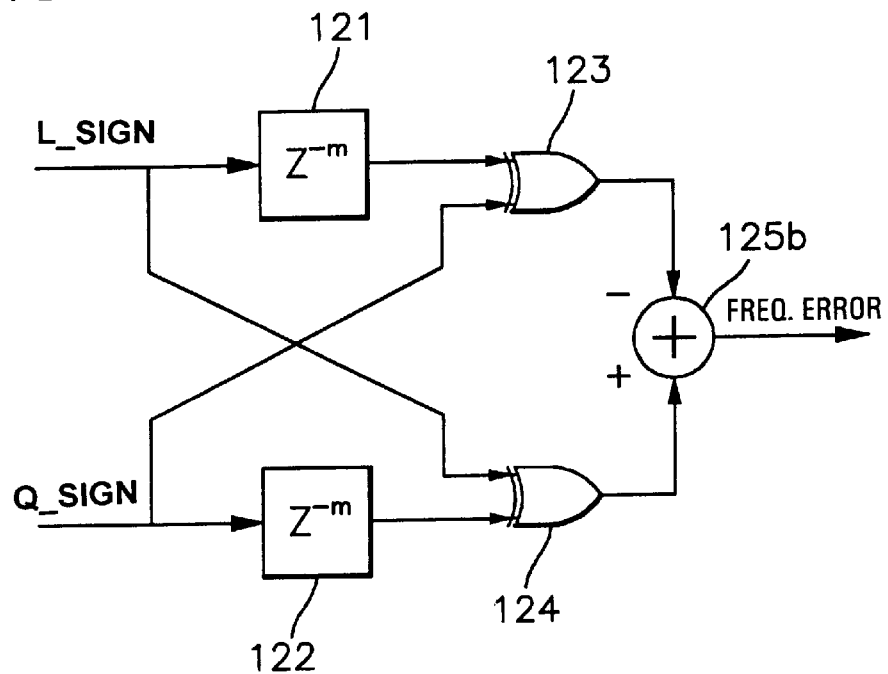
Figure 18:
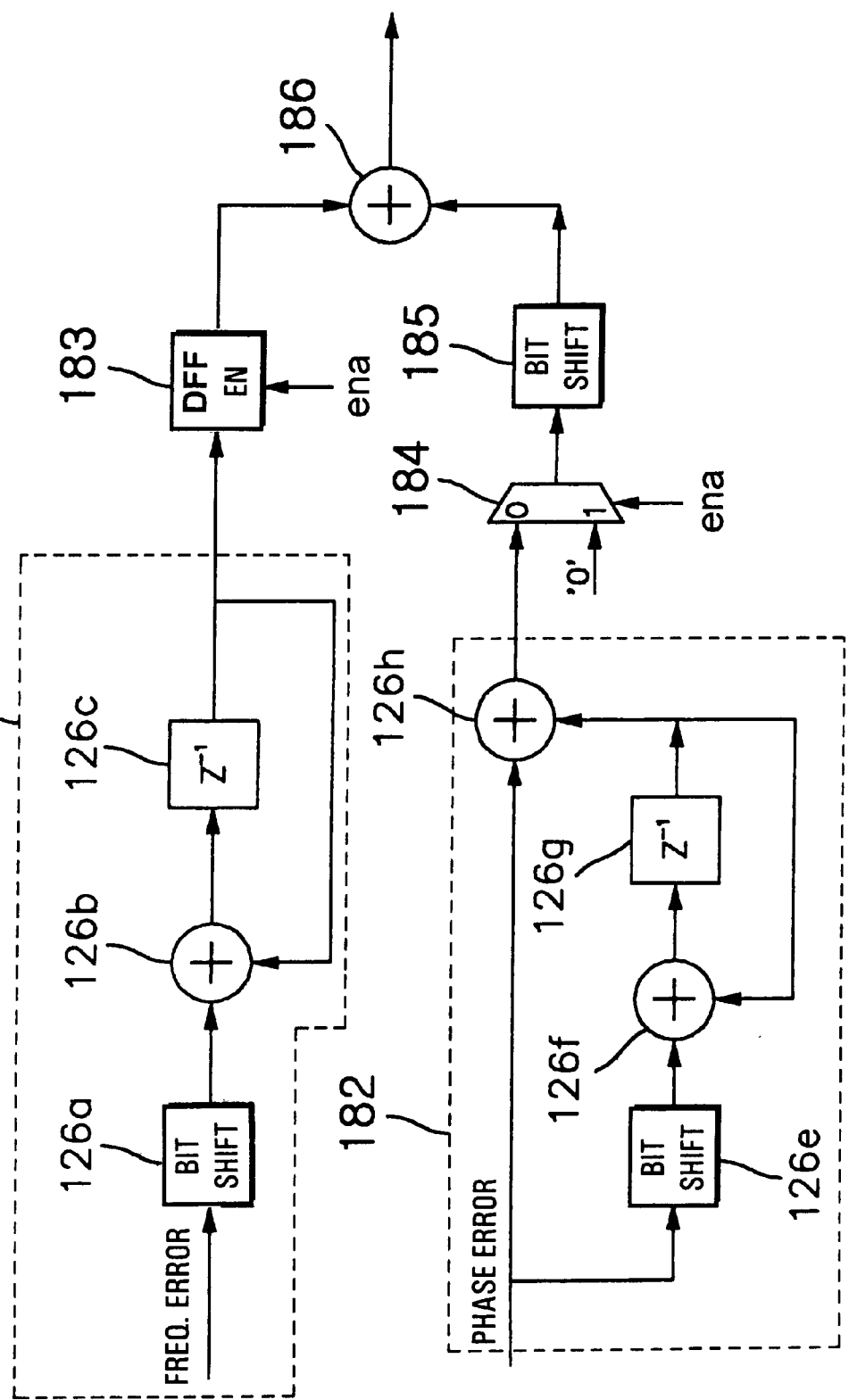
Figure 19:
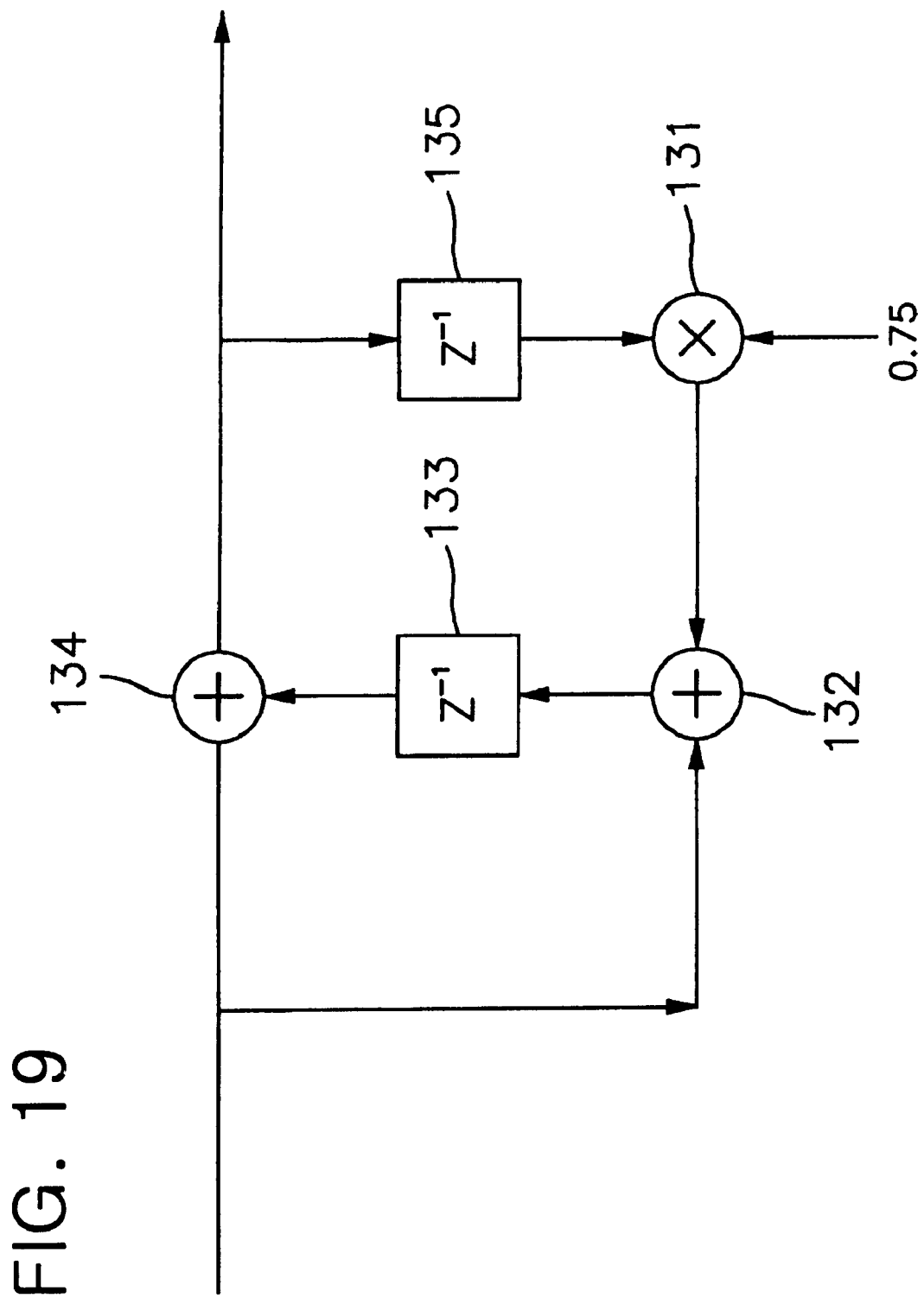
Figure 20:
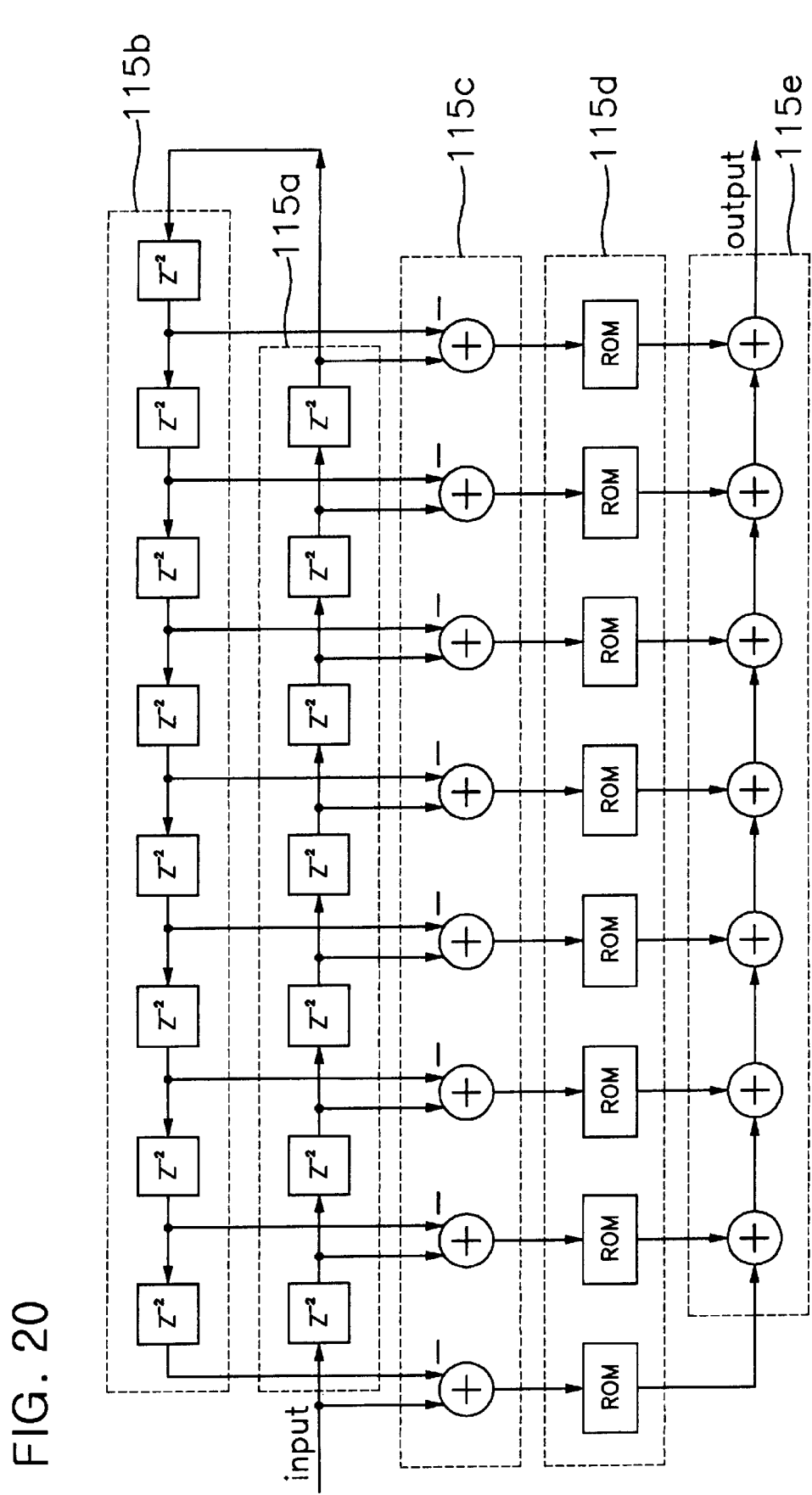

FIGS. 9(a) to 9(f) show spectrums of signals output by each blocks of a digital demodulator according to the present invention;

FIG. 10 shows detailed configuration of the embodiment of a hilbert transform unit according to the present invention;

FIG. 11 shows a complex multiplier for converting an upper-side hilbert transform signal into a base band signal;

FIG. 12 shows a complex multiplier for converting a lower-side hilbert transform signal into a base band signal;

FIG. 13 is a detailed circuit diagram of a low-pass filter according to the present invention;

FIG. 14 is a block diagram of an infinite impulse response (IIR) filter according to the present invention;

FIG. 15 is another embodiment of a multiplier used for IIP filter according to the present invention;

FIG. 16 is an embodiment of a frequency error detect unit according to the present invention;

FIG. 17 is another embodiment of a frequency error detect unit according to the present invention;

FIG. 18 is a detailed configuration of a loop filter according to the present invention;

FIG. 19 is another embodiment of an IIR filter according to the present invention; and FIG. 20 is another embodiment of the hilbert transform unit using a ROM table according to the present invention.

DETAILED DESCRIPTION OF PREFERRED EMBODIMENT

Reference will now be made in detail to the preferred embodiments of the present invention, examples of which are illustrated in the accompanying drawings.

Figure 1:
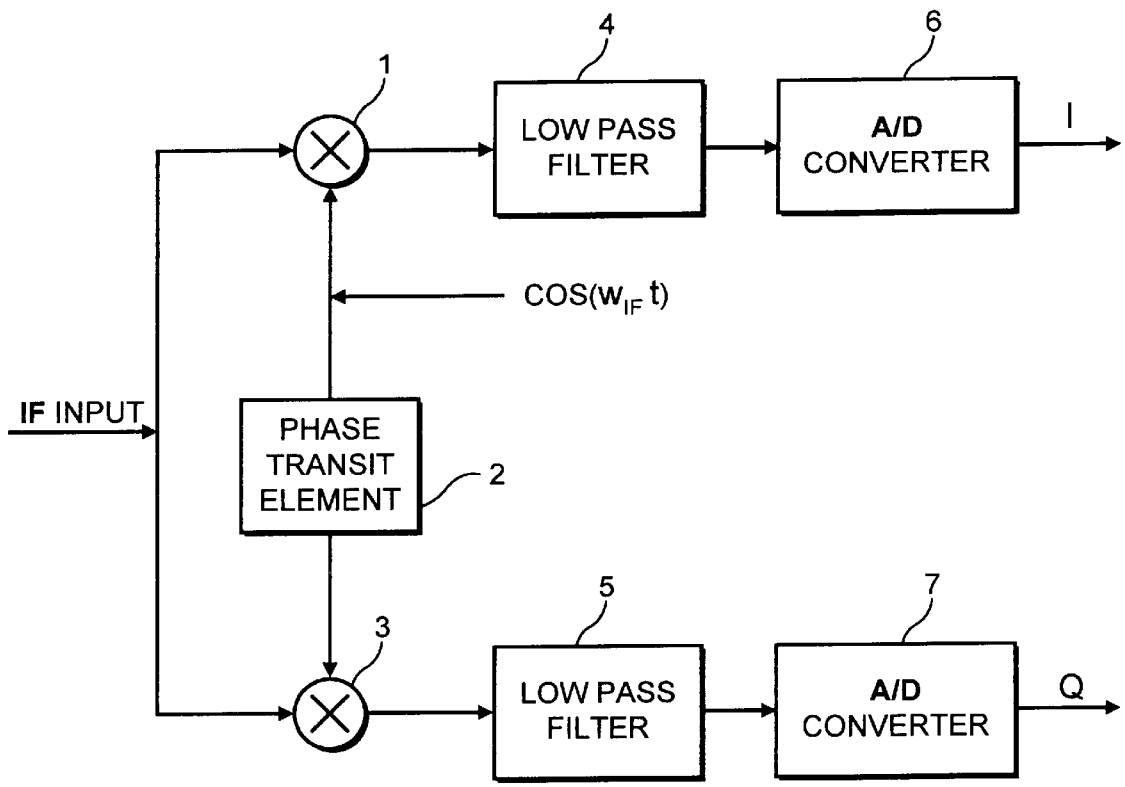
FIG. 1 shows a conventional analog VSB demodulator.
Figure 2:
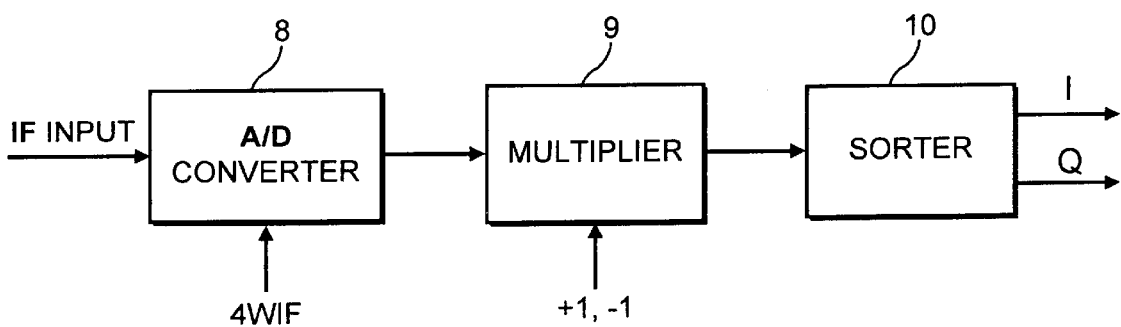
FIG. 2 shows a conventional digital VSB demodulator.
Figure 3:
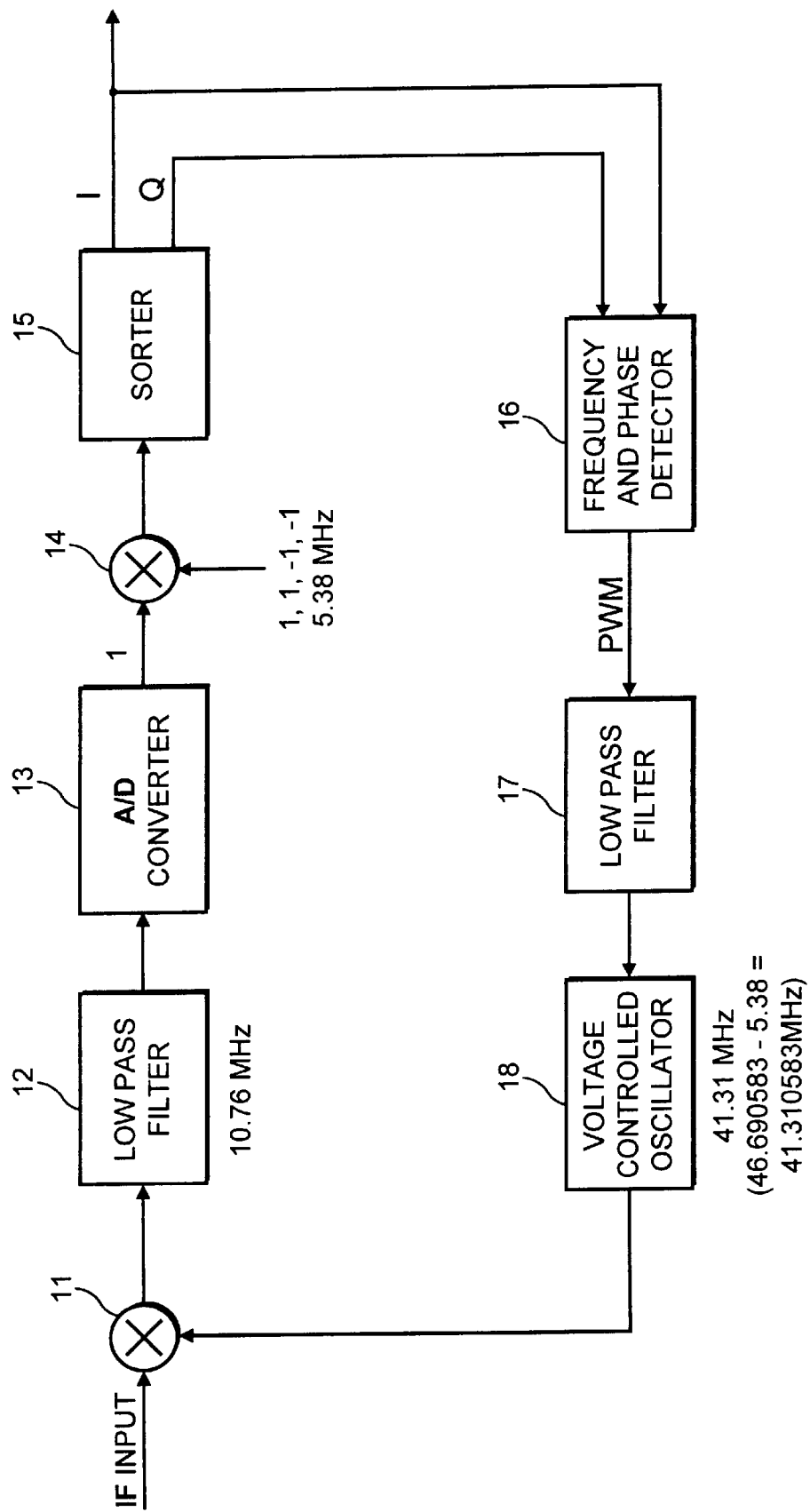
FIG. 3 shows a typical embodiment of the conventional digital VSB demodulator.
Figure 4:
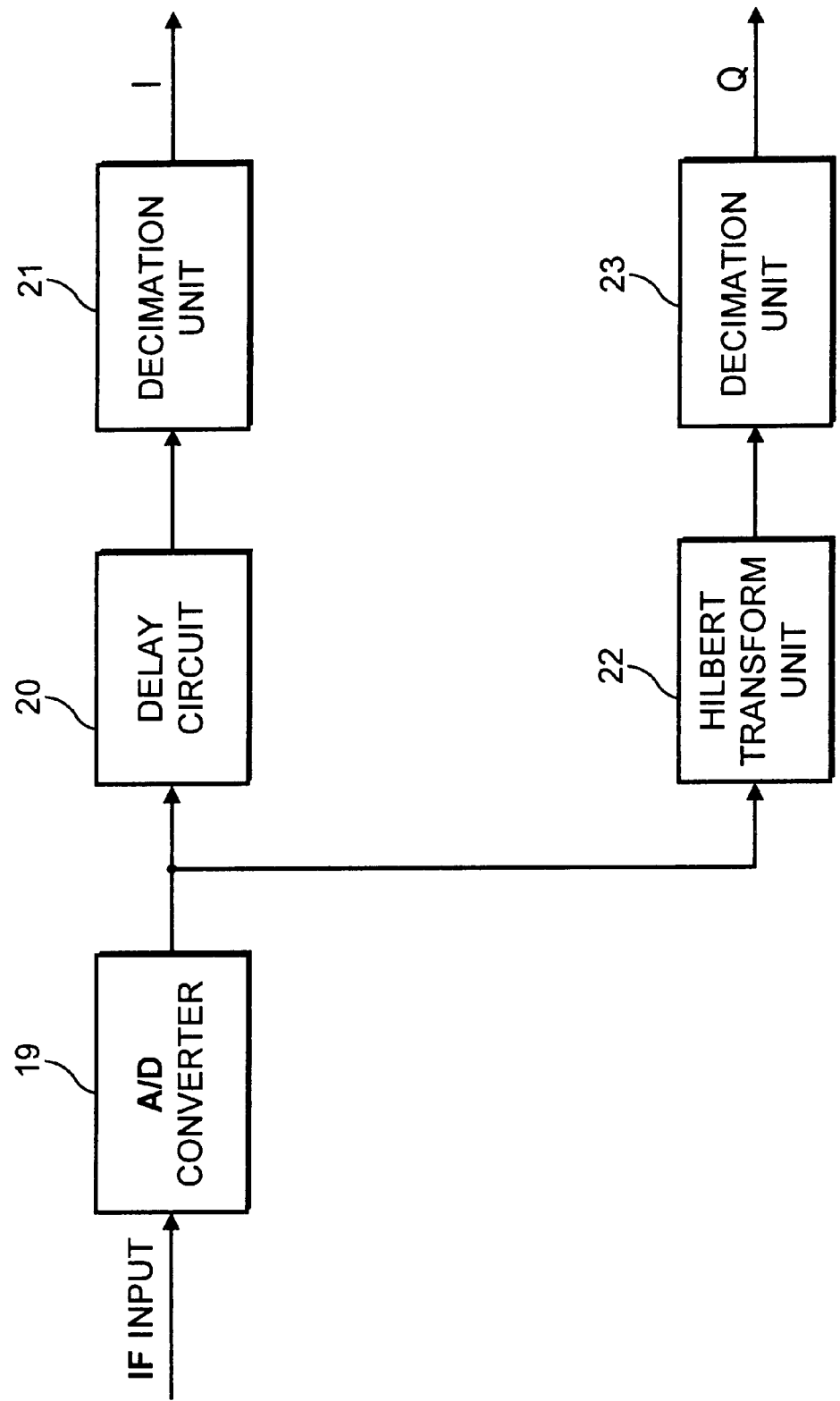
FIG. 4 shows a conventional digital demodulator using hilbert transform.
Figure 5:
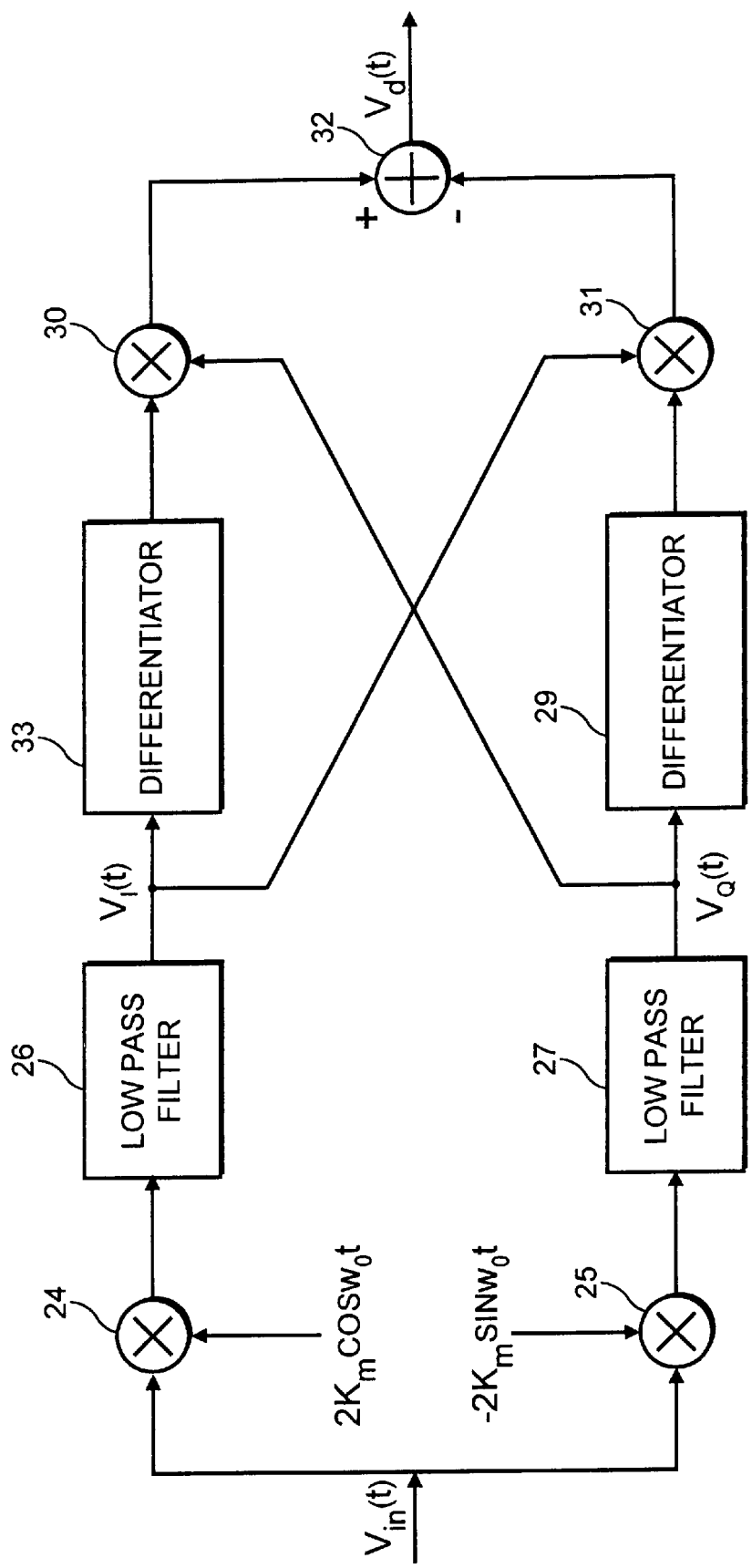
FIG. 5 shows an embodiment of a device for detecting a frequency and phase from a VSB signal.
Figure 6:
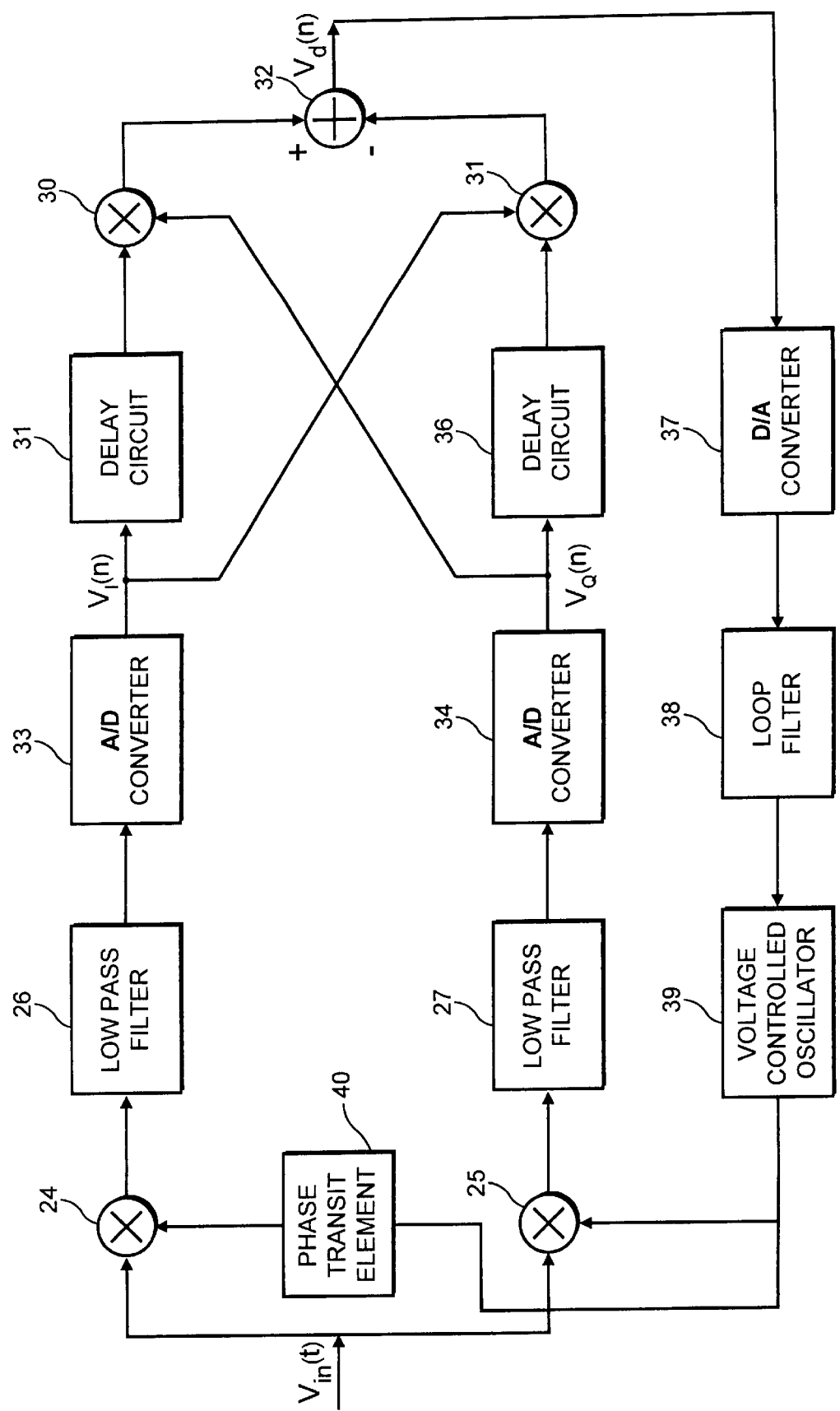
FIG. 6 shows a conventional digitalized balanced quadricorrelator.
Figure 7:
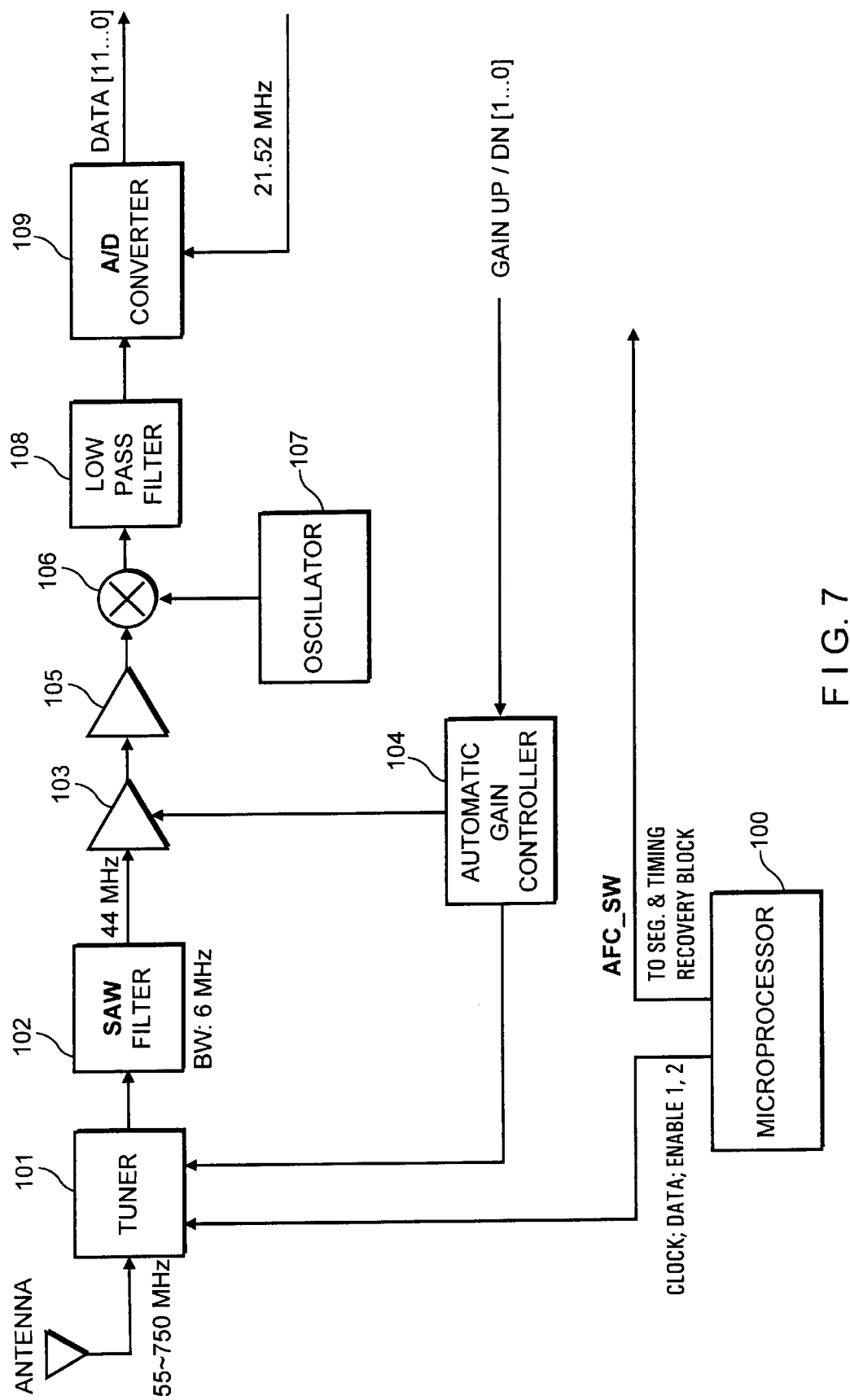
FIG. 7 is a block diagram showing configuration of the receiver of VSB mode HDTFV.

FIG. 7 is a block diagram showing configuration of the receiver of VSB mode HDTV.

A tuner 101 tunes a signal received from an antenna to a channel according to the control of a microprocessor 100. A surface acoustic wave (SAW) filter 102 filters off frequencies beyond a predetermined band from the signal tuned to channel. An amplifier 103 amplifiers the signal from the SAW filter 102 to a specified level. A variable amplifier 105 amplifies the output of the amplifier 103 according to a gain control signal generated by an automatic gain controller (AGC) 104. A mixer 106 mixes an oscillation frequency generated by an oscillator 107 with a signal from the variable amplifier 105. A low-pass filter 108 performs low-pass filtering with respect to the signal from the mixer 106. An A/D converter 109 converts the analog signal output by the low-pass filter 108 into a digital signal and sends the result of conversion to a digital demodulator.

For a usual HDTV receiver having such a configuration, as known above, the tuner 101 tunes to only a desired channel of the received signal (55–750 MHz) according to tuning control of the microprocessor 100. The SAW filter 102 receives the tuned channel signal and then passes only frequency of the predetermined band (44 Mz). The amplifier 103 amplifies the signal from the SAW filter 102 to the predetermined level. The variable amplifier 105 amplifies the output signal of the amplifier 103 variably according to the gain control value obtained from the AGC 104.

The mixer 106 mixes the signal amplified by the variable amplifier 105 with the oscillation frequency generated by the oscillator 107. The low-pass filter 108 passes the mixed signal of the predetermined band while blocking all frequencies beyond the predetermined band, thereby outputting an analog IF signal. The A/D converter 109 converts the analog IF signal into a digital IF signal and outputs it to the digital demodulator.

Figure 8:
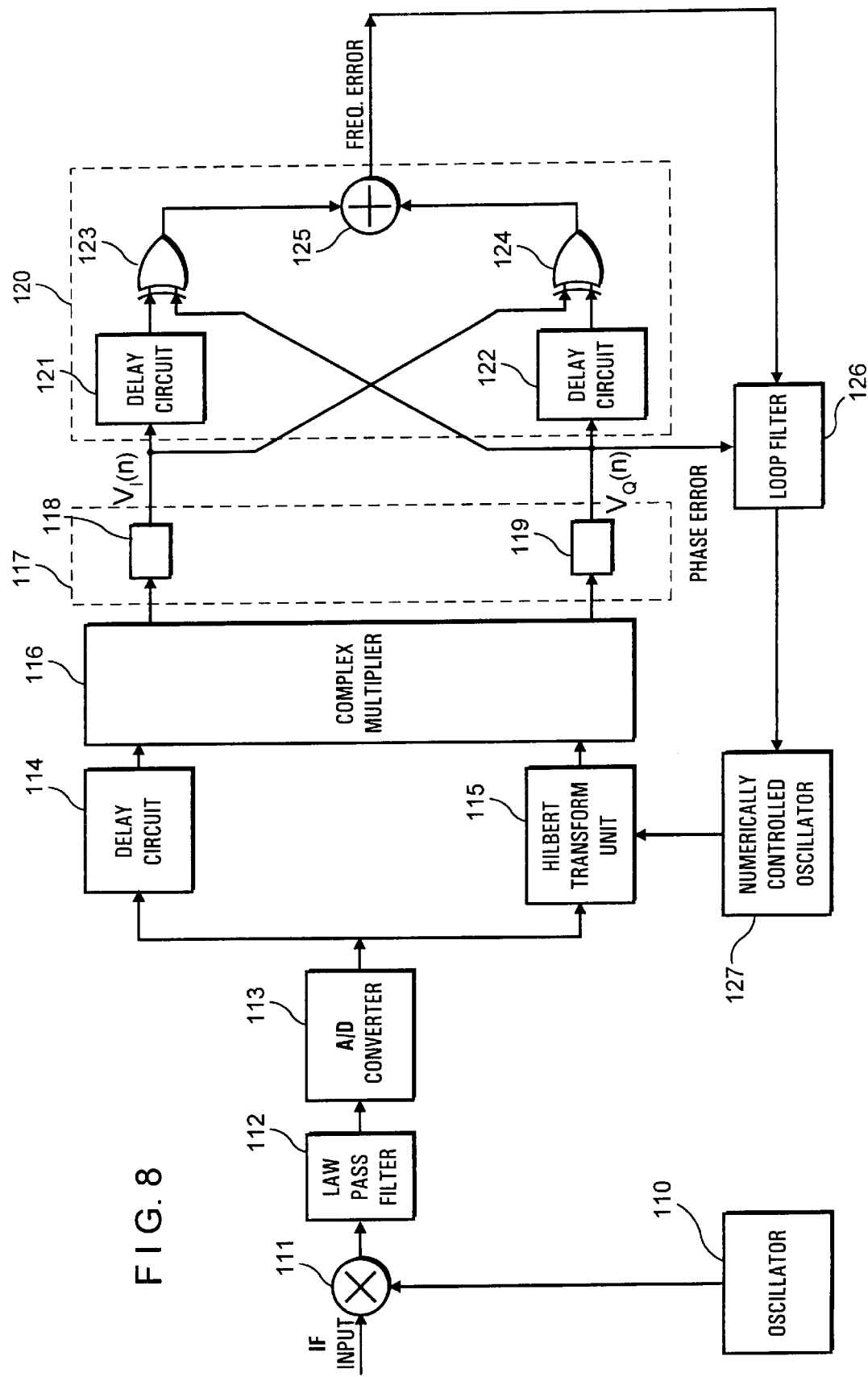
FIG. 8 shows an embodiment of a digital demodulator according to the present invention.

FIG. 8 is an embodiment of a digital demodulator according to the present invention.

An oscillator 110 generates a predetermined oscillation frequency. A mixer 111 mixes the output of the oscillator 110 with the received IF signal. A low-pass filter 112 performs low-pass filtering with respect to the output of the mixer 111. An A/D converter 113 converts the output of the low-pass filter 112 into a digital signal. A hilbert transform unit 115 transforms the output of the A/D converter 113 into a complex signal. A delay circuit 114 delays the output of the A/D converter 113. A complex multiplier 116 performs selective multiplication with respect to the outputs of the delay circuit 114 and the hilbert transform unit 115 and an oscillation frequency output by a numerically controlled oscillator 127. A pilot filter unit 117 performs digital low-pass filtering with respect to base band signals I and Q from the complex multiplier 116 so as to output direct current (DC) signals. A frequency error detect unit 120 detects a frequency error by delaying and combining the code part of the signal output by the pilot filter unit 117. A loop filter 126 generates a signal for compensating for the phase error obtained from the pilot filter 117 and frequency error obtained from the frequency error detect unit 120 for control of the numerically controlled oscillator 127.

The following description is about the operation of the digital VSB demodulator according to the present invention with reference to FIGS. 9 to 20.

Figure 9A:
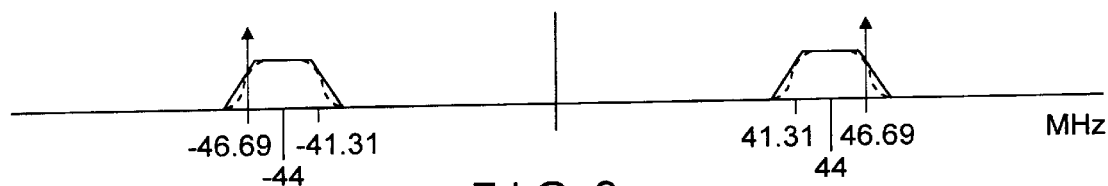
Figure 9B:
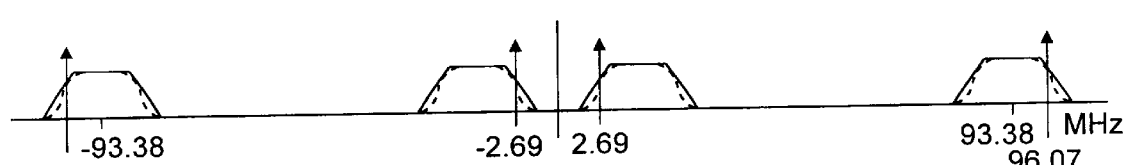

FIGS. 9(a) to 9(f) show spectrums of signals output by each blocks of a digital demodulator according to the present invention. A pilot frequency of the IF signal which is input to the digital VSB demodulator is 46.69 MHz (expressed as a symbol arrow in FIG. 9(a)). The mixer 111 mixes the IF signal of 46.69 MHz with the oscillation signal of 49.38 MHz generated by the oscillator 110 and produces a signal which has a pilot frequency of 2.69 MHz and an output spectrum as shown in FIG. 9(b).

The IF input signal is expressed as $V_{in}(t)=(s(t)+d)\cos(\omega t+\Phi)+s\hat{}(t)\sin(\omega t+\Phi)$ . . . (10), wherein 'd' denotes a pilot signal and s(t) and s^(t) are VSB demodulated signals in relation of linear transform similar to hilbert transform.

The hilbert transform is similar to the VSB transform. The hilbert transform filter shown in FIG. 10 can be considered to be equal to the VSB filter where a roll off factor is zero. Accordingly, the hilbert transform will not be discriminated from the VSB transform in following description.

Figure 9C:
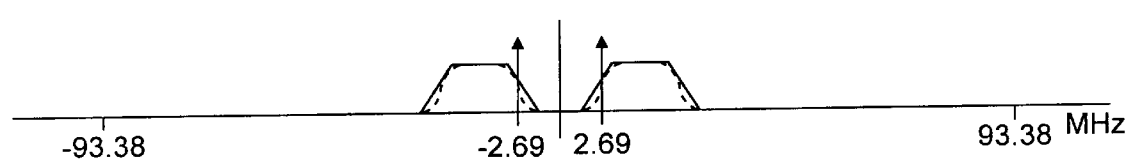

As shown in FIG. 9(c), an image spectrum of ±93.38 MHz is eliminated bypassing the signal obtained from the mixer 111 through the low-pass filter 112. The signal which passes the IF mixer 111 and low-pass filter 112 is expressed as $$LPF[V_{in}(t)\cos(\omega_0 t)]=(\tfrac{1}{2})(s(t)+d)\cos(\omega_{IF}t-\Phi)-(\tfrac{1}{2})s\hat{}(t)\sin(\omega_{IF}t-\Phi) \quad (11).$$

Figure 9D:
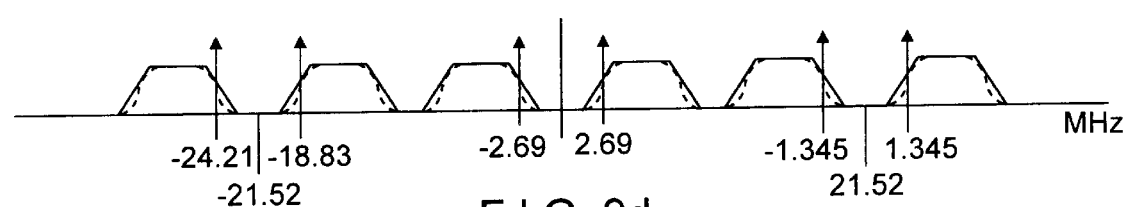
Figure 9E:
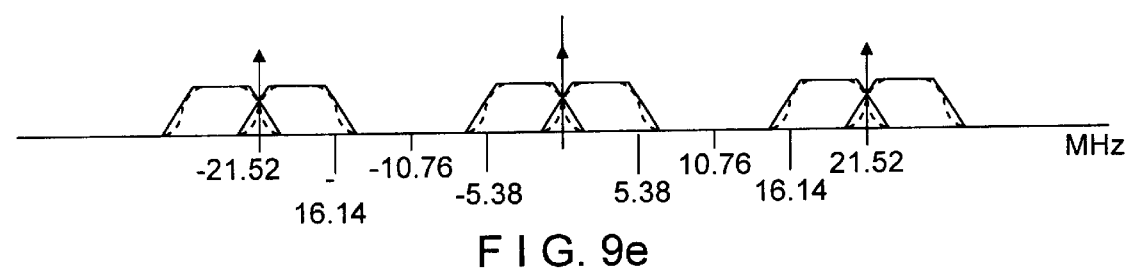
Figure 9F:
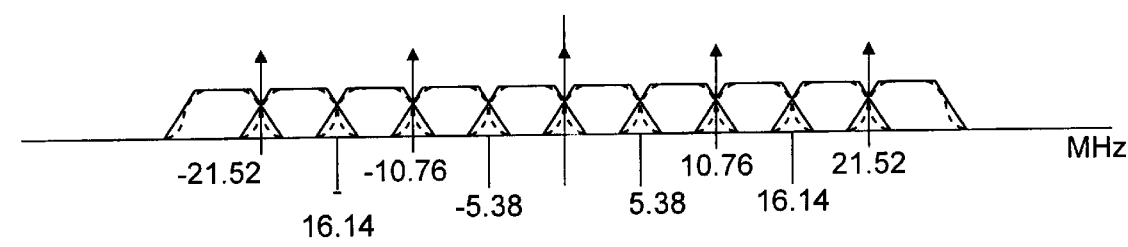

The A/D converter 113 performs sampling with respect to this signal to make 21.52 MHz which is two times of a symbol frequency and converts this signal into digital signal, thereby generating a signal having the spectrum as shown in FIG. 9(d). This signal is sent to the delay circuit 114 and hilbert transform unit 115. The signal after passing the A/D converter 113 is expressed as $I_n=(\tfrac{1}{2})(s(n)+d)\cos(\omega_{IF}n-\Phi)-(\tfrac{1}{2})s\hat{}(n)\sin(\omega_{IF}n-\Phi)$ . . . (12), wherein 'n' is an integer.

The hilbert transform unit 115 transforms the signal $I_n$ output by the A/D converter 113 into a complex signal $Q_n$ using a hilbert transform filter as shown in FIG. 10. When the signal output by the A/D converter 113 is hilbert-transformed, the signal is expressed as $Q_n=(\frac{1}{2})(s(n)+d)\sin(\omega_{IF}n-\Phi)+(\frac{1}{2})s^{\wedge}(n)\cos(\omega_{IF}n-\Phi)$ . . . (13), and when this signal is represented in a complex form, it becomes $I_n+jQ_{n-upper}=(\frac{1}{2})[s(n)+d+js^{\wedge}(n)]e^{j(\omega_{IF}n-\Phi)}$ . . . (14).

The base band signal is then restored using a digital frequency and phase lock loop (DFPLL) including the numerically controlled oscillator 127, complex multiplier 116, and loop filter 126. Where the DFPLL accurately detects frequency and phase errors, the signal after passing through the complex multiplier 116 is given as $$(I_n+jQ_n)e^{-j(\omega_{IF}n-\Phi)}$$
$$=I_n\cos(\omega_{IF}n-\Phi)+Q_n\sin(\omega_{IF}n-\Phi)+j(Q_n\cos(\omega_{IF}n-\Phi)-I_n\sin(\omega_{IF}n-\Phi)$$
$$=\tfrac{1}{2}[s(n)+d+js^{\wedge}(n)] \quad (15),$$

so the desired base band signal can be obtained.

During this process, a digital phase lock loop (DPLL) compensates for the phase error. Since the DPLL operates only after the frequency error is tracked and the compensation for the error is established in the initial stage, an automatic frequency control (AFC) must be performed. This invention utilizes a frequency difference detector (FDD) where a balanced quadricorrelator method is applied to perform the AFC. The AFC turns frequency lock on and actuates the DPLL, which compensates for the residual phase error.

FIG. 10 shows an embodiment of a hilbert transform filter applied to the present invention.

The hilbert transform filter includes a first shift register unit 115a for sequentially shifting the output signal of the A/D converter 113 to its multiple shift registers; a second shift register unit 115b for sequentially shifting the last delay output of the first shift register unit 115a to its multiple shift registers; a first adding unit 115c having a number of adders for selectively adding the signals output by the first and second shift register units 115a and 115b; a multiplication unit 115d having a number of multipliers for multiplying each signal output from the adders in the first adding unit 115c by predetermined tap coefficients h0, h2, h4, h6, h8, h10, h12, and h14; and a second adding unit 115e having a number of adders for selectively adding each signal output from the number of multipliers in the multiplication unit 115d.

In the hilbert transform using the hilbert transform filter having such configuration, when performing upper-side hilbert transform (passing positive frequency element while blocking negative frequency element) with respect to the signal from the A/D converter 113, the signal being expressed as $I_n=(\frac{1}{2})(s(n)+d)\cos(\omega_{IF}n-\Phi)\sim(\frac{1}{2})s^{\wedge}(n)\sin(\omega_{IF}n-\Phi)$ . . . (16), the result signal is expressed as $Qn\_upper=(\frac{1}{2})(s(n)+d)\sin(\omega_{IF}n-\Phi)+(\frac{1}{2})s^{\wedge}(n)\cos(\omega_{IF}n-\Phi)$ . . . (17). When representing it in a complex form, it becomes $I_n+jQ_{n-upper}=(\frac{1}{2})[s(n)+d+js^{\wedge}(n)]e^{j(\omega_{IF}n-\Phi)}$ . . . (18).

Similarly, the signal becomes $Qn\_lower=-(\frac{1}{2})(s(n)+d)\sin(\omega_{IF}n-\Phi)-(\frac{1}{2})s^{\wedge}(n)\cos(\omega_{IF}n-\Phi)$ . . . (19) by lower-side hilbert transform, and its complex form is $I_n+jQ_{n-lower}=(\frac{1}{2})[s(n)+d+js^{\wedge}(n)]e^{-j(\omega_{IF}n-\Phi)}$ . . . (20).

The Table 1—1 designates coefficients of the lower-side (a spectrum of the upper-side is eliminated) and upper-side hilbert transform filters, each filter having 31 taps. As shown in the Table 1—1, the hilbert transform filter has the following features. First, the coefficients of 15 taps including the center tap among 31 taps are "0". These 15 taps just have delay function and are not used for calculation of the output value of the filter. Second, the present output value of the filter is determined according to values contained by the remaining 16 taps. Third, two groups of taps in the right and left of the center tap have opposite symbols but the same absolute values. Fourth, the coefficients of the lower-side and upper-side hilbert transform filters have the opposite symbols. If using the above features, the number of multipliers used for a filter can be greatly decreased.

FIG. 10 shows a 31 tap hilbert transform filter as an embodiment of the hilbert transform filter, which has only 8 multipliers, 30 shift registers, and 15 two-input adders.

Since the hilbert-transformed complex signal is not a base band signal, it must be down-converted into the base band. At the same time, compensation for the frequency and phase errors is necessary. The down conversion and phase error compensation are simultaneously performed using the complex multiplier 116 and numerically controlled oscillator 127. Estimation of frequency and phase errors is performed at the frequency error detect unit 120. The complex multiplier 116 complex-multiplies the upper and lower side hilbert transform signals by a phase error signal from the numerically controlled oscillator 127 and compensates the phase.

TABLE 1-1

| tap coefficient of Lowerside Hilbert transform filter | tap coefficient of Upperside Hilbert transform filter |
|---|---|
| 1.953125e−02 | −1.953125e−02 |
| 0.0e+0 | 0.0e+00 |
| 2.734375e−02 | −2.734375e−02 |
| 0.0e+00 | 0.0e+00 |
| 3.90625e−02 | −3.90625e−02 |
| 0.0e+00 | 0.0e+00 |
| 5.46875e−02 | −5.46875e−02 |
| 0.0e+00 | 0.0e+00 |
| 7.8125e−02 | −7.8125e−02 |
| 0.0e+00 | 0.0e+00 |
| 1.171875e−01 | −1.171875e−01 |
| 0.0e+00 | 0.0e+00 |
| 2.0703125e−01 | −2.0703125e−01 |
| 0.0e+00 | 0.0e+00 |
| 6.34765625e−01 | −6.34765625e−01 |
| 0.0e+00 | 0.0e+00 |
| −6.34765625e−01 | 6.34765625e−01 |
| 0.0e+00 | 0.0e+00 |
| −2.0703125e−01 | 2.0703125e−01 |
| 0.0et00 | 0.0e+00 |
| −1.171875e−01 | 1.171875e−01 |
| 0.0e+00 | 0.0e+00 |
| −7.8125e−02 | 7.8125e−02 |
| 0.0e+00 | 0.0e+00 |
| −5.46875e−02 | 5.46875e−02 |
| 0.0e+00 | 0.0e+00 |
| −3.90625e−02 | 3.90625e−02 |

FIG. 11 illustrates a complex multiplier for converting an upper-side hilbert transform signal into a base band signal. Multipliers 116a and 116b multiply the signal $I_n$ obtained from the delay circuit 114 by respective cos and sin values obtained from the numerically controlled oscillator 127. The numerically controlled oscillator 127 has a ROM table storing cos and sin values and outputs corresponding cos and sin values in accordance with data from the loop filter 126. Multipliers 116c and 116d multiply the upper-side hilbert transform signal $Q_{n-upper}$ from the hilbert transform unit 115 by respective cos and sin values from the numerically controlled oscillator 127. Adder 116e sums up the output of the multiplier 116a and the output of the multiplier 116c and produces a base band signal. Adder 116f sums up the output of the multiplier 116b and the output of the multiplier 116d and produces a base band signal Q.

When representing the output signal of the hilbert transform unit 115, it becomes $I_n+jQ_{n-upper}=(\frac{1}{2})[s(n)+d+js\hat{}(n)]e^{j(\omega_{IF}n-\Phi)}$ ... (21). When respectively representing the estimate values of the frequency and phase with ω and θ, the complex multiplier 116 multiplies the complex signals from the hilbert transform filter by the respective cos and sin values.

When using the upper-side hilbert transform filter, $$(I_n+jQ_{n-upper})e^{-j(\omega n-\theta)}$$

$$=I_n\cos(\omega n-\theta)+Q_{n-upper}\sin(\omega n-\theta)+j(Q_{n-upper}\cos(\omega n-\theta)-I_n\sin(\omega n-\theta)) \quad (22).$$

FIG. 12 shows a complex multiplier for converting the lower-side hilbert transform signal into the base band signal. Multipliers 116g and 116h multiply the signal $I_n$ from the delay circuit 114 by the respective cos and sin oscillation signals from the numerically controlled oscillator 127. Multipliers 116i and 116j multiply the lower-side hilbert transform signal $Q_{n-lower}$ from the hilbert transform unit 115 by the respective cos and sin oscillation signals from the numerically controlled oscillator 127. An adder 116k sums up the outputs of the multipliers 116g and 116i and produces a base band signal I. An adder 116m sums up the outputs of the multipliers 116h and 116j and produces the base band signal Q.

When expressing the output signal of the hilbert transform unit 115 in the complex form, $I_n+jQ_{n-lower}=(\frac{1}{2})[s(n)+d+js\hat{}(n)]e^{-j(\omega_{IF}n-\Phi)}$ ... (23). When representing estimate values of the frequency and phase with ω and θ, the output of the complex multiplier can be expressed as multiplication of the complex signal, which is the output of the hilbert transform filter, by the output of the numerically controlled oscillator 127. When using the lower-side hilbert transform filter, $$(I_n+jQ_{n-lower})e^{j(\omega n-\theta)}$$

$$=I_n\cos(\omega n-\theta)-Q_{n-lower}\sin(\omega n-\theta)+j(I_n\sin(\omega n-\theta)-Q_{n-lower}\cos(\omega n-\theta)) \ldots (24).$$

The pilot filter unit 117 performs filtering with respect to the base band signals I and Q resulting from the above process and passes only the pilot signal. The pilot filter unit 117 includes a first low-pass filter 118 for performing the low-pass filtering of the base band signal I; and a second low-pass filter 119 for performing the low-pass filtering of the base band signal Q. The two low-pass filters 118 and 119 have the same configuration.

FIG. 13 is a detailed circuit diagram of a low-pass filter according to the present invention. The low-pass filter 118 of this invention includes a four stage cascade filter where four IIR filters 118a to 118d are connected in serial. Three delay circuits 118h to 118j are respectively coupled between four filters to delay signals output by the three filters 118a to 118c by one clock. Three dividers 118e to 118g divide clock signals input from the previous stages by 2 and then send results of division to the three delay circuits 118h to 118j.

FIG. 14 is a block diagram of an infinite impulse response (IIR) filter according to the present invention. The IIR filter 118a includes a first delay circuit 141 for delaying the signal from the complex multiplier 116 by one cycle of a clock (1/10.76 MHz); a first adder 143 for summing up the outputs of the first delay circuit 141 and multiplier 145; a second adder 142 for summing up the signal input thereto and the output of the first adder 143; a second delay circuit 144 for delaying the output signal of the second adder 142 by one cycle of the clock; and a multiplier 145 for multiplying the output signal of the second delay circuit 144 by 0.75.

The pilot filter unit 117 having such configuration extracts only the pilot signal from the signals I and Q transmitted thereto. In general, when using a finite-duration impulse response (FIR) filter, 100 or more taps are necessary to implement a low-pass filter having a passband of 100 kHz at a signal process rate of 21.52 MHz.

This invention largely decreases the number of necessary taps by using a four stage cascade filter where four IIR low-pass filters having the same coefficients are sequentially coupled in serial. As double down sampling is performed every stage, a passband of the filter decreases by ½ every stage through decimation effect, thereby creating a narrow band low-pass filter.

The following is a detailed description of the narrow band low-pass filter of this invention.

Where the output of the complex multiplier 116 is an upper side, $\frac{1}{2}[s(n)+d+js\hat{}(n)]e^{j((\omega_{IF}-\omega)n-(\Phi-\theta))}$ ... (25), so the output of the pilot filter unit 117 is expressed as $(\frac{1}{2})de^{j((\omega_{IF}-\omega)n-(\Phi-\theta))}=I_n+jQ_{n-upper}=(\frac{1}{2})d[(\cos(\omega_{IF}-\omega)n-(\Phi-\theta))+j\sin((\omega_{IF}-\omega)n-(\Phi-\theta))]$ ... (26). Therefore, if $\omega_{IF}\approx\omega$, a phase error can be estimated from an imaginary part of the output, that is, $Q_{n-upper}=-((\frac{1}{2})d)\sin(\Phi-\theta)$ ... (27).

At this time, a tap coefficient supplied to the multiplier 145 in the IIR filter is established to 0.75. As shown in FIG. 15, two shifters 128 and 129 shift the output of the delay circuit 144 to the right by 1 bit (0.5) and 2 bits (0.25) respectively, and an adder 130 sums up the outputs of the two shifters 128 and 129. Therefore, the filter can be simply implemented without using a multiplier.

When the output of the complex multiplier 116 is lower-side, $\frac{1}{2}[s(n)+d-js\hat{}(n)]e^{-j((\omega_{IF}-\omega)n-(\Phi-\theta))}$ ... (28), so the output of the pilot filter unit 117 is expressed as $(\frac{1}{2})de^{-j((\omega_{IF}-\omega)n-(\Phi-\theta))}=I_n+jQ_{n-lower}=(\frac{1}{2})d[(\cos(\omega_{IF}-\omega)n-(\Phi-\theta))-j\sin((\omega_{IF}-\omega)n-(\Phi-\theta))]$ ... (29). Therefore, if $\omega_{IF}\approx\omega$, a phase error can be estimated from the Q signal of the narrow band low-pass filter, that is, $Q_{n-lower}=((\frac{1}{2})d)\sin(\Phi-\theta)$ ... (30). This phase error signal obtained is input to a frequency error detect unit 120 and a frequency error is detected as $I_n\times Q_{n-lower-m}-Q_{n-lower}\times I_{n-m}\approx I_n\approx\frac{1}{2}d^2\sin\Delta\omega$, $\Delta\omega=\omega_{IF}-\omega$.

The frequency error detect unit 120 includes a delay circuit 121 for delaying the signal I from the pilot filter unit 117; a delay circuit 122 for delaying the signal Q from the pilot filter unit 117; an exclusive OR circuit 123 for performing an exclusive OR operation with respect to the output of the delay circuit 121 and the signal Q; an exclusive OR circuit 124 for performing the exclusive OR operation with respect to the output of the delay circuit 122 and the signal I; and an adder 125 for summing up the outputs of the two exclusive OR circuits 123 and 124 and then produces the result value as a frequency error signal.

When the hilbert transform signal is the upper-side, the adder 125 subtracts the output of the exclusive OR circuit 124 from the output of the exclusive OR circuit 123. When the hilbert transform signal is the lower-side, the adder 125 subtracts the output of the exclusive OR circuit 123 from the output of the exclusive OR circuit 124.

In such the frequency error detect unit 120, when the output of the complex multiplier 116 is the upper-side, the phase error input is expressed as $Q_{n-upper}=-((\frac{1}{2})d)\sin(\Phi-\theta)$ ... (31), so the frequency error is measured as $Q_{n-upper}\times I_{n-m}-I_n\times Q_{n-upper-m}\approx\frac{1}{2}d^2 I_n\approx\frac{1}{2}d^2\sin\Delta\omega$, $\Delta\omega=\omega_{IF}-\omega$ ... (32).

As result of simulation and actual hardware implementation examination, estimation of a frequency error is possible even when choosing signal's sign bit expressed as 2's complement and alternating multiplication with XOR. At this time, a some (several kHz order) frequency error remains in a normal state, but this error can be corrected using a DPLL. FIGS. 16 and 17 show frequency error detectors for this method, wherein 'm' denotes a frequency of delay and concerns a convergence velocity of the frequency error detector. As 'm' gets larger, the convergence velocity gets higher, but an error in the normal state gets relatively larger. When 'm' is small, the convergence velocity is low, but the error in the normal state becomes small.

After the phase and frequency errors are obtained through this progress, the loop filter 126 produces a control value for compensating for the frequency and phase errors using the error values and sends the control value to the numerically controlled oscillator 127 which compensates for the frequency and phase errors.

FIG. 18 is a block diagram of the loop filter 126 according to the present invention. The loop filter 126 includes a frequency error filter 181 for performing filtering with respective to the frequency error signal generated by the frequency error detect unit 120; a phase error filter 182 for performing filtering with respect to the phase error signal generated by the pilot filter unit 117; a D flip-flop 183 for latching the output signal of the frequency error filter 181; a multiplexer 184 for selectively outputting the signals from the phase error filter 182 according to the control signal; a bit shifter 185 for shifting the signal from the multiplexer 184; and an adder 186 for summing up the output of the bit shifter 185 and the output of the D flip-flop 183.

When an enable signal is "1", the D flip-flop 183 turns a latch state and outputs the input signal in this state, the multiplexer 184 then selects "0" among the inputs and outputs it. When an enable signal is "0", the D flip-flop 183 maintains its output state and the multiplexer 184 selects the output signal of the phase error filter 182 and outputs it.

As described above, for the operation of the DFPLL, initially the DFLL is operated for compensating for a frequency error. After a predetermined period of time, frequency lock is turned on and the DPLL is operated for compensating for the residual phase error and frequency error. If lock is released due to the change of a channel state during the operation, the above operation is repeated by receiving a start-up signal from an external microprocessor (not shown in FIG. 18). Switching operation of the DFLL and DPLL is implemented using an enable signal connected to the external microprocessor 100 in FIG. 7 and coefficients of the loop filter can be implemented just through a bit shift operation, thereby greatly decreasing the complexity of hardware.

FIG. 19 shows another embodiment of the IIR filter used for the pilot filter unit.

The IIR filter in FIG. 19 includes a first adder 132 for summing up the signal from the complex multiplier 116 and the output of the multiplier 131; a first delay circuit 133 for delaying the output signal of the first adder 132; a second adder 134 for summing up the output of the first delay circuit 133 and the signal from the complex multiplier 116; a second delay circuit 135 for delaying the output signal from the second adder 134; and a multiplier 131 for multiplying the output of the second delay circuit 135 by a tap coefficient (0.75) and sending the result to the adder 132.

In this case, although the same impulse response is used, hardware having a faster operation speed can be i mplemented through the above configuration.

FIG. 20 shows another embodiment of the hilbert transform filter where the multiplier 115d is replaced with ROM. In this case, by using a ROM table where its hardware size is relatively smaller than a multiplier, its structure is advantageous for implementing an ASIC.

As illustrated, the digital demodulator of this invention is economical because of using a cheap oscillator instead of expensive parts such as a VCO. In addition, this invention implements frequency and phase error detector just with a digital logic circuit and a digital filter including four multipliers, thereby greatly diminishing volume of hardware. Since this invention uses full digital mode, it has advantageous aspects in implementing the hardware and ASIC and also has excellent signal process power.

It will be apparent to those skilled in the art that various modifications and variations can be made in a digital demodulator of the present invention without deviating from the spirit or scope of the invention. Thus, it is intended that the present invention cover the modifications and variations of this invention provided they come within the scope of the appended claims and their equivalents.

What is claimed is:

1. A digital demodulator comprising local oscillation means, mixing means, A/D conversion means, hilbert transform means, delay means, multiplication means, filter means, frequency error detect means, a loop filter and numerically controlled oscillation means:

wherein the hilbert transform means comprises:
a first shift register for sequentially shifting a received signal to multiple shift registers;
a second shift register for sequentially shifting a last delay output of the first shift register to multiple shift registers;
a first adding unit having a number of adders for selectively adding signals output by the first and second shift registers;
a multiplication unit having a number of multipliers for respectively multiplying the signals output from the adders in the first adding unit by predetermined tap coefficients; and
a second adding unit having a number of adders for performing selective adding of each signal output from the number of multipliers in the multiplication unit, and wherein the frequency error detect means comprises:
a first delay circuit for delaying the signal I from the filter means;
a second delay circuit for delaying the signal Q from the filter means;
a first exclusive OR circuit for performing an exclusive OR operation with respect to the output of the delay circuit and the signal Q;
a second exclusive OR circuit for performing the exclusive OR operation with respect to the output of the delay circuit and the signal I; and
an adder for summing up the outputs of the two exclusive OR circuits.

2. The digital demodulator according to claim 1, wherein the filter means comprises: four infinite impulse response (IIR) filters which are connected in serial and form a four stage cascade filter; three delay circuits which are respectively connected between four IIR filters and delay signals from the filters by one clock; and three divider for dividing clock signals received from the previous stage by 2 and supplying the results of division to the delay circuits.

3. The digital demodulator according to claim 1, wherein the filter means passes only the pilot signals of the signals T and Q transmitted from the multiplication means.

4. The digital demodulator according to claim 1, wherein the loop filter means comprises: a frequency error filter for performing filtering with respective to the frequency error signal generated by the frequency error detect means; a phase error filter for performing filtering with respect to the phase error signal generated by the filter means; a D flip-flop for latching the output signal of the frequency error filter; a multiplexer for selectively outputting the signals from the phase error filter according to a control signal; a bit shifter for shifting the signal from the multiplexer; and an adder for summing up the output of the bit shifter and the output of the D flip-flop.

5. The digital demodulator according to claim 1, wherein
the second shift register sequentially shifts the output of the first shift register to multiple shift registers; and
the hilbert transform means includes:
ROMs which store signals and outputs corresponding signals to each signal output from the adders in the first adding unit; and
the number of adders of the second adding unit performing selective adding of multiple signals output by the ROMs.

6. The digital demodulator according to claim 1, wherein the multiplication means comprises:
a first complex multiplier comprising first and second multipliers for multiplying an input signal $I_n$ by respective phase error control signals from the numerically controlled oscillation means; third and fourth multipliers for multiplying an upper-side hilbert transform signal $Q_{n-upper}$ obtained from the hilbert transform means by the respective phase error control signals from the numerically controlled oscillation means; a first adder for summing up the output of the first multiplier and the output of the third multiplier and producing the base band signal I; and a second adder for summing up the outputs of the second and fourth multipliers and producing the base band signal Q, and
a second complex multiplier comprising first and second multipliers for multiplying an input signal $I_n$ by respective phase error control signals from the numerically controlled oscillation means; third and fourth multipliers for multiplying a lower-side hilbert transform signal $Q_{n-lower}$ obtained from the hilbert transform means by the respective phase error control signals from the numerically controlled oscillation means; a first adder for summing up the output of the first multiplier and the output of the third multiplier and producing the base band signal I; and a second adder for summing up the output of the second multiplier and the output of the fourth multiplier and producing the base band signal Q.

7. The digital demodulator according to claim 1, wherein the filter means comprises four IIR filters, three delay circuits and three dividers;
said IIR filters comprising a first delay circuit for delaying the signal from the multiplication means by one cycle of a clock;
a first adder for summing up the outputs of the first delay circuit and a multiplier;
a second adder for summing up a signal input thereto and the output of the first adder;
a second delay circuit for delaying the output signal of the second adder by one cycle of the clock; and
the multiplier for multiplying the output signal of the second delay circuit by 0.75.

8. The digital demodulator according to claim 1, wherein, if the base band signal received is an upper-side signal, the adder in frequency error detect means subtracts the output of the second exclusive OR circuit from the output of the first exclusive OR circuit.

9. The digital demodulator according to claim 1, wherein, if the base band signal received is a lower-side signal, the adder in frequency error detect means subtracts the output of the first exclusive OR circuit from the output of the second exclusive OR circuit.

10. The digital demodulator according to claim 7, wherein the multiplier comprises:
two shifters for shifting the output of the second delay circuit to the right by 1 bit and 2 bits respectively; and
an adder for summing up the outputs of the two shifters.

* * * * *